(12) United States Patent
Tada et al.

(10) Patent No.: US 11,049,787 B2
(45) Date of Patent: Jun. 29, 2021

(54) SEMICONDUCTOR DEVICE AND METHOD OF MANUFACTURING THE SAME

(71) Applicant: Mitsubishi Electric Corporation, Tokyo (JP)

(72) Inventors: Haruna Tada, Tokyo (JP); Dai Nakajima, Tokyo (JP); Yasuyuki Sanda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/339,044

(22) PCT Filed: Oct. 19, 2017

(86) PCT No.: PCT/JP2017/037803
§ 371 (c)(1),
(2) Date: Apr. 3, 2019

(87) PCT Pub. No.: WO2018/079396
PCT Pub. Date: May 3, 2018

(65) Prior Publication Data
US 2020/0043824 A1    Feb. 6, 2020

(30) Foreign Application Priority Data

Oct. 31, 2016   (JP) .............................. JP2016-212892

(51) Int. Cl.
*H01L 21/56*   (2006.01)
*H01L 23/367*   (2006.01)
(Continued)

(52) U.S. Cl.
CPC ........ *H01L 23/367* (2013.01); *H01L 21/4882* (2013.01); *H01L 21/56* (2013.01); *H01L 23/3121* (2013.01)

(58) Field of Classification Search
CPC ... H01L 23/3675; H01L 21/565; H01L 23/29; H01L 23/293; H01L 23/3107; H01L 25/07; H01L 25/18
See application file for complete search history.

(56) References Cited

U.S. PATENT DOCUMENTS

2004/0040327 A1   3/2004   Iida et al.

FOREIGN PATENT DOCUMENTS

DE    10 2014 209 837 A1   11/2015
JP       2003023280 A     1/2003
(Continued)

OTHER PUBLICATIONS

International Search Report (PCT/ISA/210) and Written Opinion (PCT/ISA/237) dated Dec. 26, 2017, by the Japan Patent Office as the International Searching Authority for International Application No. PCT/JP2017/037803.

(Continued)

*Primary Examiner* — Fernando L Toledo
*Assistant Examiner* — Valerie N Newton
(74) *Attorney, Agent, or Firm* — Buchanan Ingersoll & Rooney PC

(57) ABSTRACT

A metal component and a heat dissipation member are integrated with each other in a plurality of protrusion-recess portions where the plurality of recess portions and the plurality of protrusion portions contact each other. A first protrusion-recess portion as a part of the plurality of protrusion-recess portions is greater in height direction dimension than a second protrusion-recess portion other than the first protrusion-recess portion among the plurality of protrusion-recess portions. A wall surface of the first protrusion-recess portion includes a first wall surface portion having a first inclination angle to a height direction, and a second wall (Continued)

surface portion having a second inclination angle different from the first inclination angle.

16 Claims, 27 Drawing Sheets

(51) Int. Cl.
    *H01L 21/48*     (2006.01)
    *H01L 23/31*     (2006.01)

(56) References Cited

FOREIGN PATENT DOCUMENTS

| | | | | |
|---|---|---|---|---|
| JP | 2011222564 | A | 11/2011 | |
| JP | 2013165122 | A | 8/2013 | |
| JP | 2014179394 | A | 9/2014 | |
| JP | 5975909 | B2 * | 8/2016 | ............. H01L 23/36 |

OTHER PUBLICATIONS

Office Action dated Jun. 23, 2020, by the German Patent Office in corresponding German Patent Application No. 112017005498.2 and English translation of the Office Action. (14 pages).

Office Action (Notice of Reasons for Refusal) dated Jun. 16, 2020, by the Japanese Patent Office in corresponding Japanese Patent Application No. 2018-547612 and English translation of the Office Action. (8 pages).

\* cited by examiner

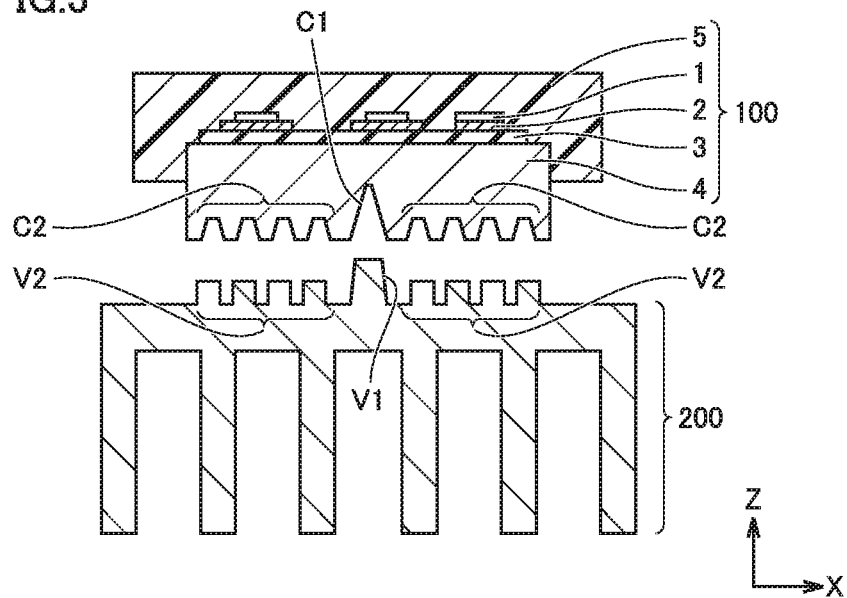
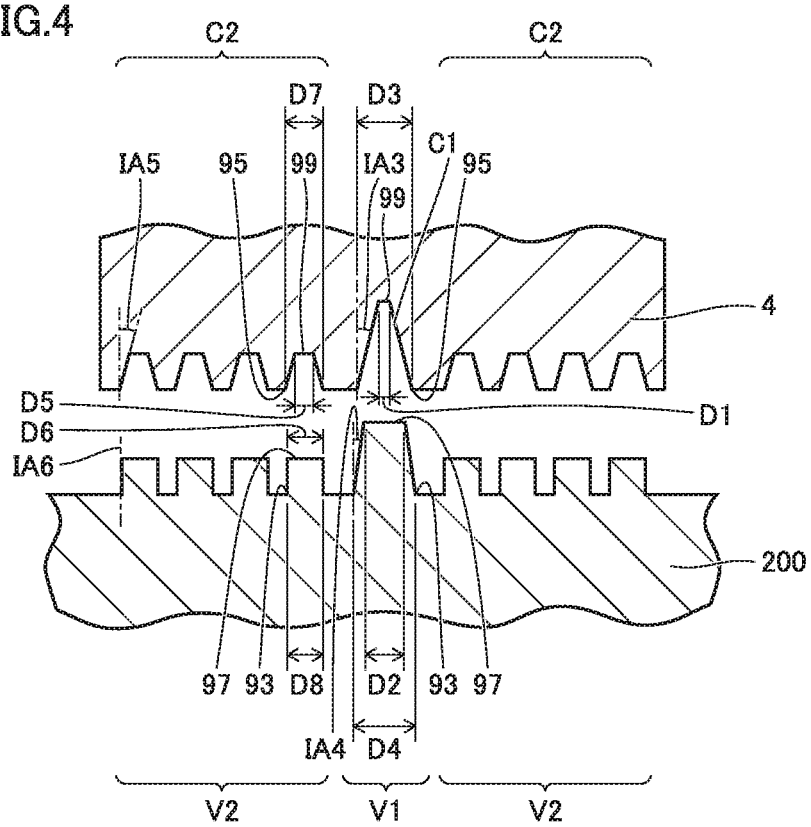

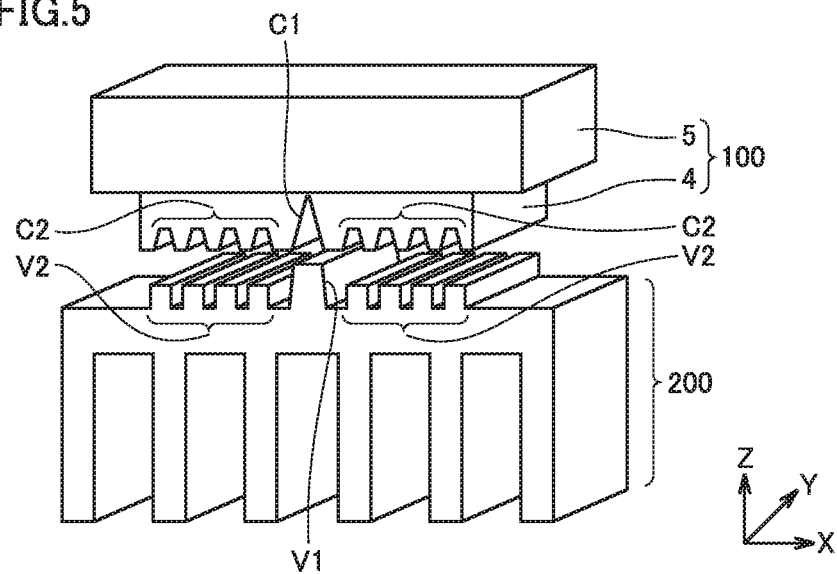
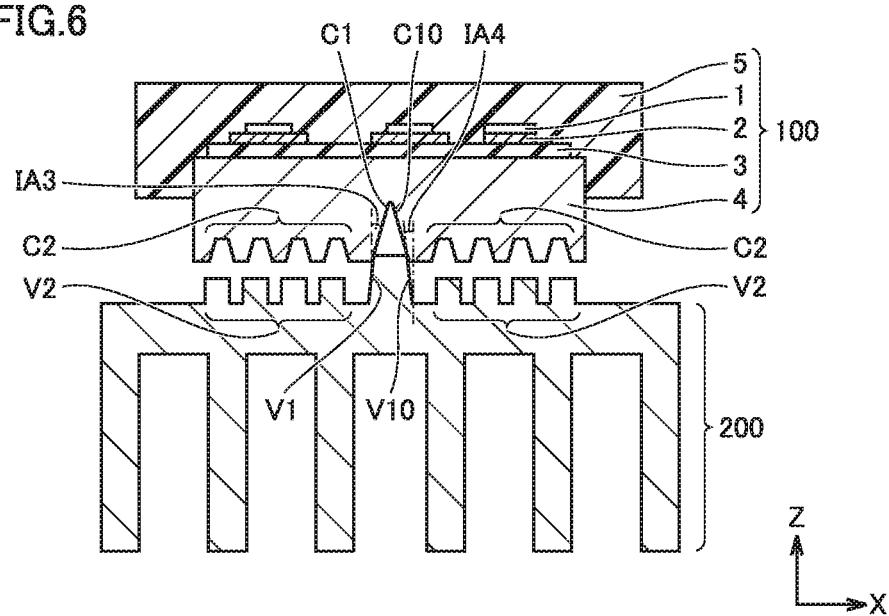

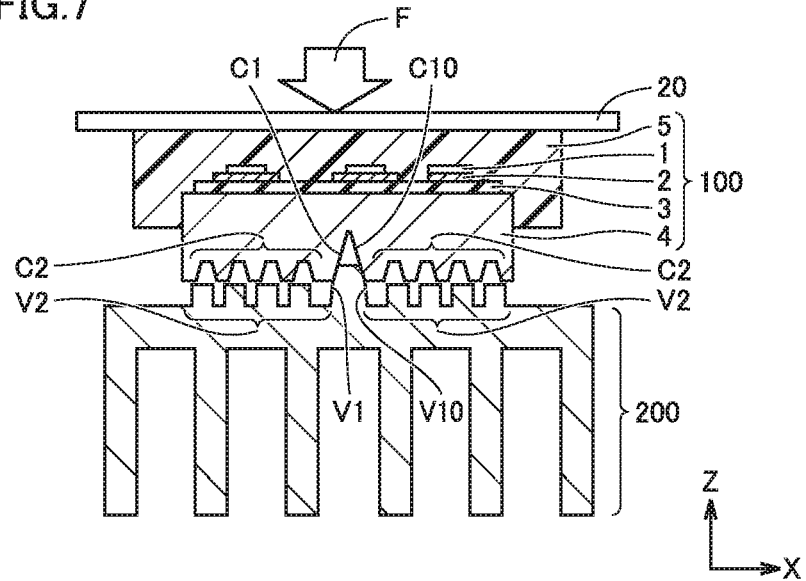
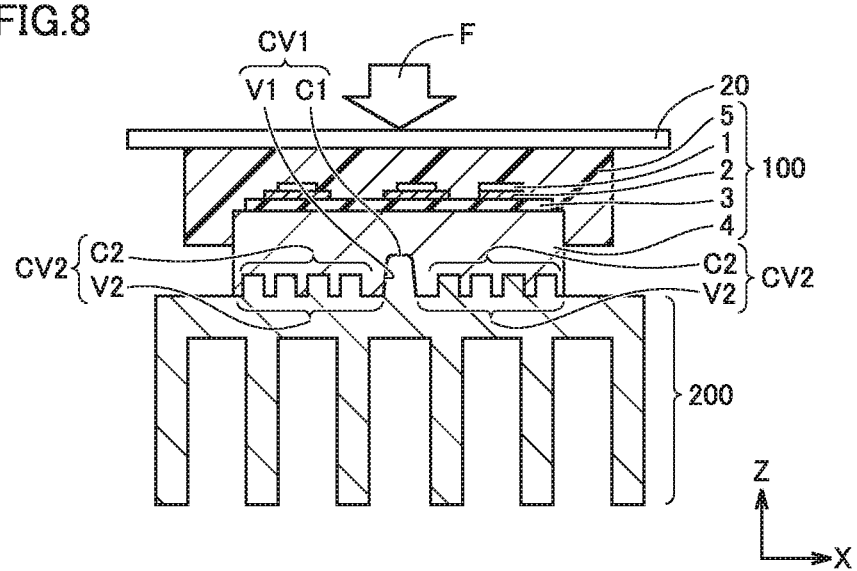

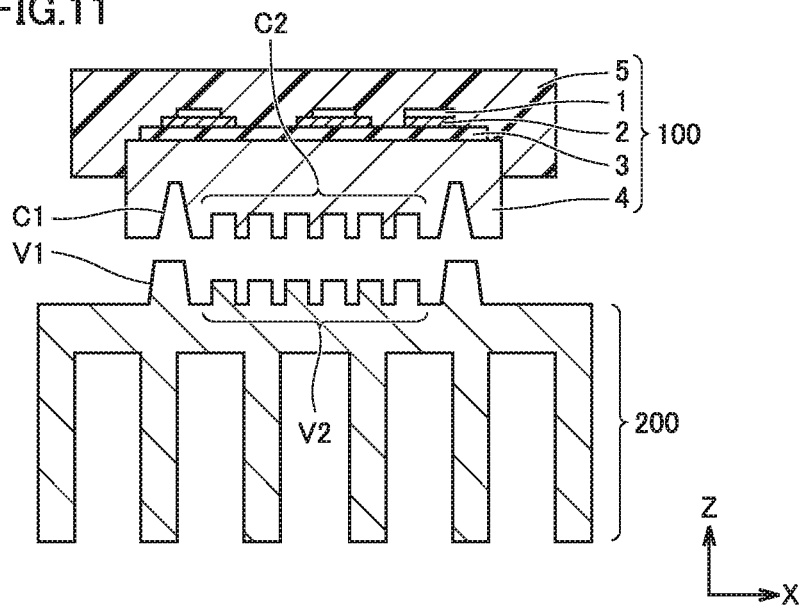
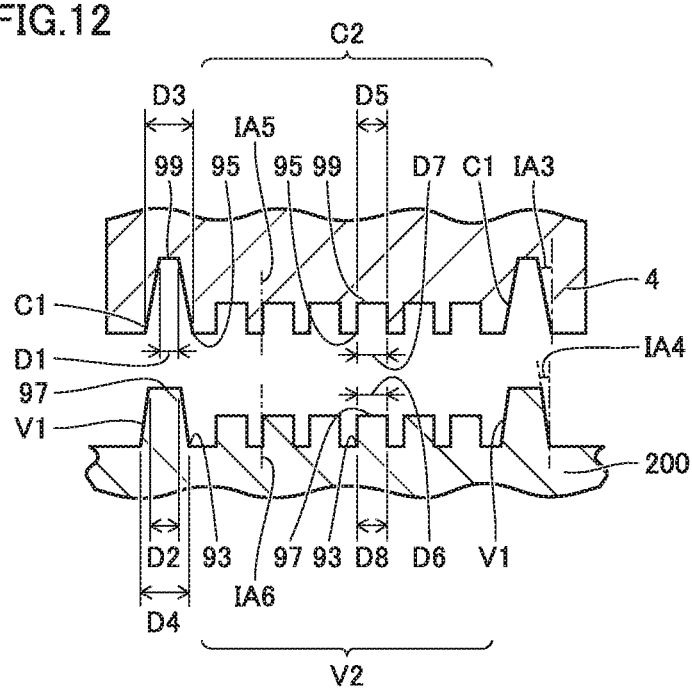

SEMICONDUCTOR DEVICE AND METHOD OF MANUFACTURING THE SAME

TECHNICAL FIELD

The present invention relates to a semiconductor device and a method of manufacturing the semiconductor device, and particularly to a semiconductor device structured such that a power module and a heat sink are connected to each other, and a method of manufacturing the semiconductor device.

BACKGROUND ART

In a semiconductor device including a conventional power module, the power module and a heat sink are thermally connected by a heat conductive grease. However, when a heat conductive grease is used, there is a concern that problems such as a so-called pump-out phenomenon or bleed may occur during long-term use. Also when a heat conductive grease is used, the thermal resistance of the entire power module may increase. Thus, as an alternative to a method of connecting a power module and a heat sink included in a semiconductor device with a heat conductive grease, a greaseless connection method has been developed. As an example of the greaseless connection method, it is conceivable to use a processing method of integrating a power module and a heat sink with each other through caulking performed in a protrusion-recess portion provided in a joining surface between the power module and the heat sink. This method is disclosed in Japanese Patent Laying-Open No. 2014-179394 (PTL 1), for example, by which a power module and a heat sink are connected without using grease. Accordingly, it is expected that the reliability of the semiconductor device is ensured during long-term use, and that the heat dissipation performance from the power module to the heat sink is maintained.

CITATION LIST

Patent Literature

PTL 1: Japanese Patent Laying-Open No. 2014-179394

SUMMARY OF INVENTION

Technical Problem

A power module included in a semiconductor device disclosed in Japanese Patent Laying-Open No. 2014-179394 has a configuration in which a semiconductor element, solder, an interconnection member, an insulating layer, and a metal component are integrated through a sealing member. The metal component is provided with a protrusion-recess portion having a protruded and recessed shape. Furthermore, the heat sink connected to the power module has a surface facing the metal component and provided with a protrusion-recess portion having a protruded and recessed shape so as to be capable of being fitted into the protrusion-recess portion of the metal component. In the state where the power module including the metal component and the heat sink are stacked, press load is applied to plastically deform the protrusion-recess portion. Thereby, the metal component of the power module and the heat sink are joined and integrated with each other.

The protrusion-recess portions of the power module and the heat sink in Japanese Patent Laying-Open No. 2014-179394 include a protrusion-recess portion having a large dimension in the height direction of the semiconductor device, and a protrusion-recess portion having a small dimension in the height direction of the semiconductor device. This improves the heat dissipation performance from the power module to the heat sink. However, for that purpose, it is considered that all of the formed protrusion-recess portions need to be completely fitted and firmly fixed to each other. Since the protrusion-recess portion is formed by machining such as forging, die-casting and extrusion, this protrusion-recess portion is to have a shape with dimension variations (tolerance). Due to dimension variations in the protrusion-recess portion, and also due to variations in the positional relation between the metal component and the heat sink, the power module and the heat sink may be integrated with each other in the state where the power module is displaced while being inclined relative to the original joining manner.

When the power module is integrated with the heat sink while being inclined relative to the heat sink, the thermal resistance in the contact portion therebetween increases or varies, so that the power module cannot achieve a desired heat dissipation performance. Furthermore, when pressure is applied by press load in the state where the power module is inclined relative to the heat sink, there are concerns about problems that a sealing member is broken due to stress concentration, an installation failure occurs in the assembly step after caulking. In order to increase the installation accuracy of the apparatus for the assembly step for suppressing installation failures, it is necessary to perform processes such as adjustment for eliminating the variations in member dimensions and the like so as to arrange the planes of the members in parallel with each other. Specifically, it is necessary to perform processes of: confirming the shape of each member; maintaining the parallel state between the planes; and applying pressure while maintaining the parallel state. For performing these processes, it is necessary to use a large-scale and high-cost apparatus, which may prevent improvement of productivity.

The present invention has been made to solve the above-described problems. An object of the present invention is to provide: a semiconductor device including a power module and a heat sink that can be integrated with each other with excellent productivity and stability without having to use a large-scale apparatus while being capable of suppressing the inclination occurring during processing for integration and also suppressing thermal resistance variations caused thereby; and a method of manufacturing the semiconductor device.

Solution to Problem

A semiconductor device of the present invention includes a power module and a heat dissipation member. The heat dissipation member is connected to the power module. A metal component is provided with one of (i) a plurality of recess portions and (ii) a plurality of protrusion portions while the heat dissipation member is provided with the other of (i) a plurality of recess portions and (ii) a plurality of protrusion portions. The metal component and the heat dissipation member are integrated with each other in a plurality of protrusion-recess portions where the plurality of recess portions contact the plurality of protrusion portions. A first protrusion-recess portion as a part of the plurality of protrusion-recess portions is greater in height direction dimension than a second protrusion-recess portion other than the first protrusion-recess portion among the plurality of protrusion-recess portions. The first protrusion-recess portion has a wall surface including: a first wall surface portion having a first inclination angle to a height direction; and a second wall surface portion having a second inclination angle different from the first inclination angle.

Another semiconductor device of the present invention includes a power module and a heat dissipation member. The heat dissipation member is connected to the power module. A metal component is provided with one of (i) a plurality of recess portions and a plurality of outer inclined surface portions and (ii) a plurality of protrusion portions while the heat dissipation member is provided with the other of (i) a plurality of recess portions and a plurality of outer inclined surface portions and (ii) a plurality of protrusion portions. The metal component and the heat dissipation member are integrated with each other in a plurality of first protrusion-recess portions where the plurality of outer inclined surface portions contact the plurality of protrusion portions, and in a plurality of second protrusion-recess portions where the plurality of recess portions contact the plurality of protrusion portions. The plurality of first protrusion-recess portions are greater in height direction dimension than the plurality of second protrusion-recess portions. One pair of first protrusion-recess portions is disposed such that the first protrusion-recess portions are spaced apart from each other. The one pair of first protrusion-recess portions extends such that one pair of protrusion portions each included in a corresponding one of the one pair of first protrusion-recess portions is inclined from a base portion toward a leading end along the plurality of outer inclined surface portions relative to a height direction. Each of the plurality of first protrusion-recess portions has a wall surface including: a first wall surface portion having a first inclination angle to the height direction; and a second wall surface portion having a second inclination angle different from the first inclination angle.

In a method of manufacturing a semiconductor device of the present invention, a power module is first prepared, and a heat dissipation member to be connected to the power module is then prepared. A metal component is provided with one of (i) a plurality of recess portions and (ii) a plurality of protrusion portions while the heat dissipation member is provided with the other of (i) a plurality of recess portions and (ii) a plurality of protrusion portions. The plurality of recess portions and the plurality of protrusion portions are fitted into each other to form a plurality of protrusion-recess portions, thereby integrating the metal component and the heat dissipation member with each other. A first protrusion-recess portion as a part of the plurality of protrusion-recess portions is greater in height direction dimension than a second protrusion-recess portion other than the first protrusion-recess portion among the plurality of protrusion-recess portions. A wall surface of a first recess portion of the plurality of recess portions that is to be included in the first protrusion-recess portion is formed as an inclined surface inclined to a height direction. A wall surface of a first protrusion portion of the plurality of protrusion portions that is to be included in the first protrusion-recess portion is formed as an inclined surface inclined to the height direction. The wall surface of the first recess portion is different in inclination angle from the wall surface of the first protrusion portion. In the integrating, the first recess portion and the first protrusion portion contacts each other to plastically deform at least one of the first recess portion and the first protrusion portion.

In another method of manufacturing a semiconductor device of the present invention, a power module is first prepared, and a heat dissipation member to be connected to the power module is then prepared. A metal component is provided with one of (i) a plurality of recess portions and (ii) a plurality of protrusion portions while the heat dissipation member is provided with the other of (i) a plurality of recess portions and (ii) a plurality of protrusion portions. The plurality of recess portions and the plurality of protrusion portions are fitted into each other to form a plurality of protrusion-recess portions, thereby integrating the metal component and the heat dissipation member with each other. A first protrusion-recess portion as a part of the plurality of protrusion-recess portions is greater in height direction dimension than a second protrusion-recess portion other than the first protrusion-recess portion among the plurality of protrusion-recess portions. A wall surface of a first recess portion of the plurality of recess portions that is to be included in the first protrusion-recess portion is formed as an inclined surface inclined to a height direction. A wall surface of a first protrusion portion of the plurality of protrusion portions that is to be included in the first protrusion-recess portion is formed as an inclined surface inclined to the height direction. One pair of first protrusion-recess portions is formed such that the first protrusion-recess portions are spaced apart from each other. A center-to-center distance between bottom portions of one pair of first recess portions to be included in the one pair of first protrusion-recess portions is different from a center-to-center distance between leading ends of one pair of first protrusion portions to be included in the one pair of first protrusion-recess portions. In the integrating, the first recess portion and the first protrusion portion contact each other to plastically deform at least one of the first recess portion and the first protrusion portion.

In still another method of manufacturing a semiconductor device of the present invention, a power module is first prepared, and a heat dissipation member to be connected to the power module is then prepared. A metal component is provided with one of (i) a plurality of recess portions and a plurality of outer inclined surface portions and (ii) a plurality of protrusion portions while the heat dissipation member is provided with the other of (i) a plurality of recess portions and a plurality of outer inclined surface portions and (ii) a plurality of protrusion portions. The plurality of recess portions and the plurality of protrusion portions are fitted into each other, and the plurality of outer inclined surface portions and the plurality of protrusion portions are fitted into each other, to form a plurality of protrusion-recess portions, thereby integrating the metal component and the heat dissipation member with each other. A first protrusion-recess portion among the plurality of protrusion-recess portions that is formed of an outer inclined surface portion of the plurality of outer inclined surface portions and a protrusion portion of the plurality of protrusion portions is greater in height direction dimension than a second protrusion-recess portion among the plurality of protrusion-recess portions that is formed of a recess portion of the plurality of recess portions and the protrusion portion. A wall surface of the outer inclined surface portion to be included in the first protrusion-recess portion is formed as an inclined surface inclined to a height direction. A wall surface of a first protrusion portion of the plurality of protrusion portions that is to be included in the first protrusion-recess portion is formed as an inclined surface inclined to the height direction. One pair of first protrusion-recess portions is formed such that the first protrusion-recess portions are spaced apart from each other. A distance between inner circumferences of bottom portions of one pair of outer inclined surface portions to be included in the one pair of first protrusion-recess portions is greater than a center-to-center distance between leading ends of one pair of first protrusion portions to be included in the one pair of first protrusion-recess portions. The distance between inner circumferences is provided in forming the plurality of recess portions, the plurality of outer inclined surface portions and the plurality of protrusion portions. In the integrating, the outer inclined surface portion and the first protrusion portion contact each other to plastically deform at least one of the first recess portion and the first protrusion portion.

Advantageous Effects of Invention

According to the present invention, the first recess portion and the first protrusion portion to form the first protrusion-recess portion greater in height direction dimension than the second protrusion-recess portion functions as a guide mechanism when a metal component and a heat dissipation member are integrated with each other. In other words, the first protrusion-recess portion serves to prevent a power module and a heat sink from being integrated with each other in the state where the power module is displaced while being inclined relative to the original joining manner. Thereby, it becomes possible to provide a semiconductor device with excellent productivity and stability and with reduced variations in thermal resistance.

BRIEF DESCRIPTION OF DRAWINGS

FIG. 3 is a schematic cross-sectional view showing the state of recess portions and protrusion portions formed in each of a metal component and a heat sink before integration of the metal component and the heat sink with each other, according to the first example of the first embodiment.

FIG. 4 is an enlarged schematic cross-sectional view showing dimensions and the like of each of the recess portions and the protrusion portions in FIG. 3.

FIG. 5 is a schematic perspective view showing the first step of a method of manufacturing a semiconductor device according to the first example of the first embodiment.

FIG. 6 is a schematic cross-sectional view showing the second step of the method of manufacturing a semiconductor device according to the first example of the first embodiment.

FIG. 7 is a schematic cross-sectional view showing the third step of the method of manufacturing a semiconductor device according to the first example of the first embodiment.

FIG. 8 is a schematic cross-sectional view showing the fourth step of the method of manufacturing a semiconductor device according to the first example of the first embodiment.

FIG. 11 is a schematic cross-sectional view showing the state of recess portions and protrusion portions formed in each of a metal component and a heat sink before integration of the metal component and the heat sink with each other, in the second example of the first embodiment.

FIG. 12 is an enlarged schematic cross-sectional view showing dimensions and the like of each of the recess portions and the protrusion portions in FIG. 11.

DESCRIPTION OF EMBODIMENTS

The embodiments of the present invention will be hereinafter described with reference to the accompanying drawings.

First Embodiment

Figure 1:
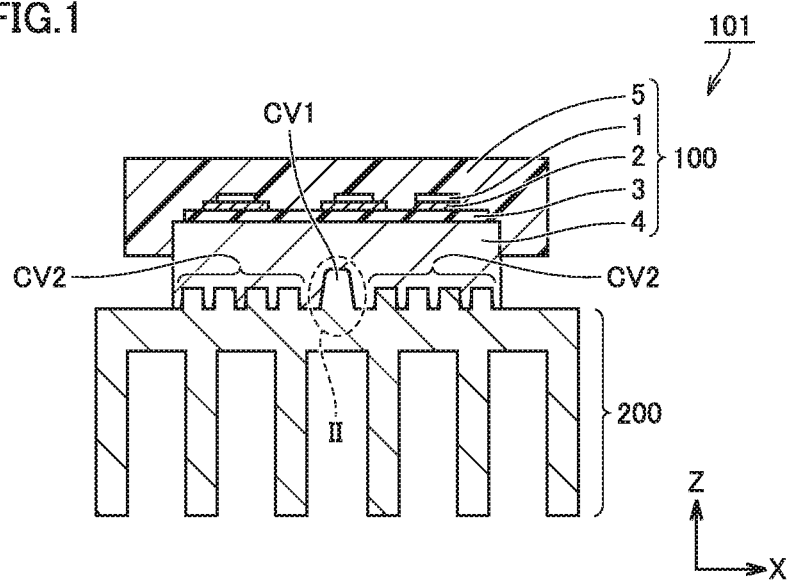
FIG. 1 is a schematic cross-sectional view showing the configuration of a semiconductor device according to the first example of the first embodiment.

The configuration of a semiconductor device in the first example of the present embodiment will be first described with reference to FIGS. 1 to 4. For the convenience of explanation, the X direction, the Y direction and the Z direction are employed. Referring to FIG. 1, a semiconductor device 101 in the first example of the present embodiment includes a power module 100 and a heat sink 200 that is connected to power module 100 to serve as a heat dissipation member. Power module 100 includes a semiconductor element 1, an interconnection member 2 to which semiconductor element 1 is connected, an insulating layer 3 connected to interconnection member 2, a metal component 4 connected to interconnection member 2 with insulating layer 3 interposed therebetween, and a sealing member 5. Thus, metal component 4 is fixed to semiconductor element 1. Conversely, semiconductor element 1 is mounted on metal component 4. Sealing member 5 serves to seal semiconductor element 1, interconnection member 2, insulating layer 3, and a part of metal component 4 (an upper region in the Z direction in FIG. 1). At least a part (a lower region in the Z direction in FIG. 1) of metal component 4 is exposed from sealing member 5.

Semiconductor element 1 is a chip-shaped member made of a semiconductor material such as silicon. Circuit elements such as a metal oxide semiconductor field effect transistor (MOSFET) are incorporated into semiconductor element 1. Interconnection member 2 is a lead frame on which semiconductor element 1 is placed, for example, and formed of a copper-based material or an iron-based material, for example. Insulating layer 3 is a plate-shaped member made of aluminum nitride and having insulation performance, for example, and formed in a rectangular shape in a plan view, for example. Semiconductor element 1 is joined, for example, with solder to the lead frame as interconnection member 2. Also, the lead frame is joined to metal component 4 with insulating layer 3 interposed therebetween.

Sealing member 5 seals semiconductor element 1, interconnection member 2, insulating layer 3, and a part of metal component 4 to thereby protect semiconductor element 1 and interconnection member 2 from an external environment. Furthermore, when the part required to be insulated in terms of preventing an electric short circuit is covered by sealing member 5, high insulation reliability over the part required to be insulated is achieved. Sealing member 5 is formed so as to seal semiconductor element 1 and the like shown in FIG. 1 by a method of introducing a resin material into a resin case or by a forming method of introducing a resin material into a metal mold without using a resin case. Also, a part of metal component 4 (an upper region in the Z direction in FIG. 1) is covered by sealing member 5 while another part of metal component 4 (a lower region in the Z direction in FIG. 1) is exposed from sealing member 5. The lower region of metal component 4 that is exposed from sealing member 5 faces heat sink 200.

Metal component 4 serves to dissipate heat emitted from semiconductor element 1, and therefore, has a thickness in the Z direction. The heat diffused into metal component 4 is further propagated to heat sink 200 located therebelow. Heat sink 200 is provided with a heat dissipation fin for dissipating the heat generated from semiconductor element 1 and interconnection member 2 to the outside of semiconductor device 101. By this heat dissipation fin, heat is dissipated from heat sink 200 to the outside of semiconductor device 101.

It is preferable that metal component 4 and heat sink 200 each are formed of a material with high thermal conductivity. Thereby, the thermal resistance in each of the members can be reduced. Specifically, it is preferable that metal component 4 and heat sink 200 each are formed of any one selected from aluminum, copper or an alloy material containing aluminum and copper as main components. Alternatively, the above-mentioned materials may be combined to form metal component 4 and heat sink 200. For example, when metal component 4 and heat sink 200 each are formed of a metal material or an alloy material containing aluminum as a main component, these members can be further reduced in weight.

Metal component 4 may be different in hardness from heat sink 200. Metal component 4 may be higher in hardness than heat sink 200. Conversely, metal component 4 may be lower in hardness than heat sink 200.

Metal component 4 and heat sink 200 are connected, for example, so as to be integrated with each other. Namely, metal component 4 and heat sink 200 are fixed to each other such that the boundary between metal component 4 and heat sink 200 becomes indistinct in the lowermost part of metal component 4 and the uppermost part of heat sink 200 in the Z direction. Specifically, the lowermost part of metal component 4 is provided with a first protrusion-recess portion CV1 and a second protrusion-recess portion CV2 as a plurality of protrusion-recess portions. At first protrusion-recess portion CV1 and second protrusion-recess portion CV2, the lower portion of metal component 4 and the upper portion of heat sink 200 are integrated with each other. In this case, first protrusion-recess portion CV1 and second protrusion-recess portion CV2 are a region including a portion corresponding to inclination correction mechanism portions C1 and V1 and connection portions C2 and V2 before processing described later (if remained in a finished product, remaining inclination correction mechanism portions C1 and V1 and remaining connection portions C2 and V2), and also means a region formed of a portion (made of metal) where the lower portion of metal component 4 and the upper portion of heat sink 200 are integrated with each other. When metal component 4 and heat sink 200 are fixed to each other, pressure is applied preferably to the wall surface portion of second protrusion-recess portion CV2 to the extent that at least one of metal component 4 and heat sink 200 is slightly plastically deformed. By such pressure application, the residual compression applied from metal component 4 and heat sink 200 to each other is accumulated in the wall surface portion, so that the fixing force is increased. Accordingly, the design for protection against vibrations and impacts may be readily implemented. As will be described later, residual compression distortion remains in second protrusion-recess portion CV2, thereby achieving an effect of reducing the thermal contact resistance between the wall surfaces of the recess portion and the protrusion portion.

In FIG. 1, one first protrusion-recess portion CV1 is disposed in the center portion in the X direction. A plurality of second protrusion-recess portions CV2 are disposed at a distance from each other so as to sandwich first protrusion-recess portion CV1 therebetween from the right and left sides in the X direction. Four second protrusion-recess portions CV2 are disposed on each of the right and left sides of first protrusion-recess portion CV1 in the X direction as in FIG. 1, which is however shown in a cross-sectional view. Therefore, a greater number of second protrusion-recess portions CV2 may actually be disposed in semiconductor device 101.

First protrusion-recess portion CV1 as a part of the plurality of protrusion-recess portions is greater in dimension in the height direction, that is, in the Z direction, than second protrusion-recess portion CV2 as another part of the plurality of protrusion-recess portions other than first protrusion-recess portion CV1.

Figure 2:
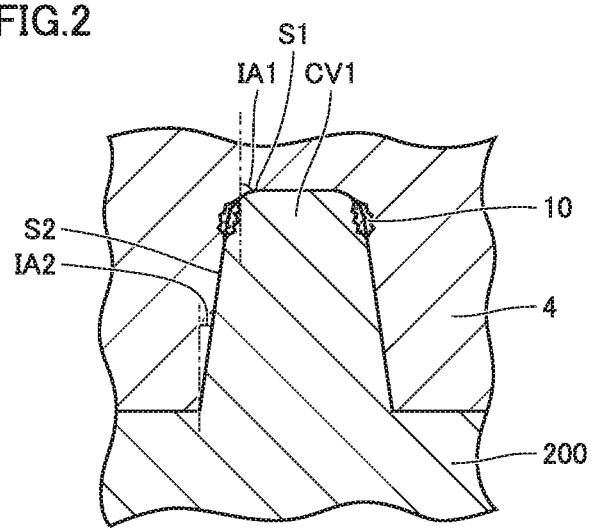
FIG. 2 is an enlarged schematic cross-sectional view of a region II surrounded by a dotted line in FIG. 1.

FIG. 2 is an enlarged schematic cross-sectional view more specifically showing the configuration of a region: including metal component 4 and heat sink 200 integrated with each other; and particularly corresponding to first protrusion-recess portion CV1 in FIG. 1. Referring to FIG. 2, the wall surface of first protrusion-recess portion CV1 includes a first wall surface portion S1 and a second wall surface portion S2. First wall surface portion S1 has a first inclination angle IA1 to the height direction, that is, the Z direction. Also, first wall surface portion S1 is formed in a region adjacent to the uppermost part of first protrusion-recess portion CV1 in the Z direction so as to be rounded, for example. Second wall surface portion S2 has a second inclination angle IA2 to the Z direction and is formed in a linear shape, for example, below first wall surface portion S1 in the Z direction. Second inclination angle IA2 is different from first inclination angle IA1. For example, in FIG. 2, first inclination angle IA1 is greater than second inclination angle IA2.

FIG. 3 shows the state of metal component 4 and heat sink 200 before integration of metal component 4 and heat sink 200 with each other as shown in FIG. 1. Referring to FIG. 3, before integration, the lowermost surface of metal component 4 is provided with: an inclination correction mechanism portion C1 as a recess portion that is recessed upward in the figure relative to the lowermost surface; and a connection portion C2 as a recess portion relative to the lowermost surface. Also, the uppermost surface of heat sink 200 is provided with: an inclination correction mechanism portion V1 as a protrusion portion that protrudes upward in the figure relative to the uppermost surface; and a connection portion V2 as a protrusion portion relative to the uppermost surface. In this case, these inclination correction mechanism portions C1, V1 and connection portions C2, V2 mean the surfaces (wall surfaces) provided with the recess portions or the protrusion portions.

When the lowermost surface of metal component 4 and the uppermost surface of heat sink 200 facing each other are moved close to each other so as to contact each other, for example, inclination correction mechanism portion V1 is inserted into inclination correction mechanism portion C1, and connection portion V2 is inserted into connection portion C2. When inclination correction mechanism portion C1 and inclination correction mechanism portion V1 are integrated with each other, for example, via connection in the inserted state as described above, first protrusion-recess portion CV1 is formed. Similarly, when connection portion C2 and connection portion V2 are integrated with each other, for example, via connection, second protrusion-recess portion CV2 is formed. Again referring to FIG. 2, as a result of the integration as described above, at least a part of the wall surface of first protrusion-recess portion CV1 is provided with a firm fixed portion 10 where inclination correction mechanism portion C1 and inclination correction mechanism portion V1 are firmly connected to each other. Firm fixed portion 10 is formed, for example, by caulking between inclination correction mechanism portion C1 and inclination correction mechanism portion V1, as described later. In FIG. 2, by way of example, firm fixed portion 10 is formed in a first wall surface portion S1 and a region adjacent thereto that are located in the upper portion of first protrusion-recess portion CV1 in the Z direction, but not limited thereto, and may be formed in the lower portion of first protrusion-recess portion CV1 in the Z direction, for example.

Second protrusion-recess portion CV2 also basically has the same configuration as that of first protrusion-recess portion CV1 described above.

Inclination correction mechanism portion C1 is formed as the first recess portion on the lowermost surface of metal component 4. In FIG. 3, one inclination correction mechanism portion C1 is formed in the center portion in the X direction. Connection portion C2 is formed as the second recess portion on the lowermost surface of metal component 4. In FIG. 3, a plurality of (four) connection portions C2 arranged side by side are formed on each of the right and left sides in the X direction so as to sandwich inclination correction mechanism portion C1 therebetween. Inclination correction mechanism portion V1 is formed as the first protrusion portion on the uppermost surface of heat sink 200. In FIG. 3, one inclination correction mechanism portion V1 is formed in the center portion in the X direction. Connection portion V2 is formed as the second protrusion portion on the uppermost surface of metal component 4. In FIG. 3, a plurality of (four) connection portions V2 arranged side by side are formed on each of the right and left sides in the X direction so as to sandwich inclination correction mechanism portion V1 therebetween. However, since FIG. 3 shows a cross-sectional view, a greater number of connection portions C2 and V2 are actually formed.

In this way, metal component 4 is provided with inclination correction mechanism portion C1 and connection portion C2 as a plurality of recess portions while heat sink 200 is provided with inclination correction mechanism portion V1 and connection portion V2 as a plurality of protrusion portions. In contrast, metal component 4 may be provided with a plurality of protrusion portions while heat sink 200 may be provided with a plurality of recess portions.

Metal component 4 and heat sink 200 are integrated with each other in a plurality of first protrusion-recess portions CV1 where a plurality of inclination correction mechanism portions C1 and a plurality of inclination correction mechanism portions V1 contact each other. Also, metal component 4 and heat sink 200 are integrated with each other in a plurality of second protrusion-recess portions CV2 where a plurality of connection portions C2 and a plurality of connection portions V2 contact each other. In this way, metal component 4 and heat sink 200 are integrated with each other in a plurality of protrusion-recess portions where first protrusion-recess portion CV1 and second protrusion-recess portion CV2 contact each other.

Referring to FIG. 3, in the state before metal component 4 and heat sink 200 are integrated with each other as shown in FIG. 1, the inclination angle of the wall surface of inclination correction mechanism portion C1 in the Z direction is at least partially greater than the inclination angle of the wall surface of inclination correction mechanism portion V1 in the Z direction. In FIG. 3, the inclination angle of inclination correction mechanism portion C1 in the Z direction is entirely greater than the inclination angle of inclination correction mechanism portion V1 in the Z direction. As a result, for example, as shown in FIG. 2, the width of first protrusion-recess portion CV1 in the X direction, that is, the dimension of first protrusion-recess portion CV1 in the X direction in FIG. 2, is reduced toward (upward in FIG. 2) the bottom portion of the recess portion included in first protrusion-recess portion CV1.

Referring to FIG. 4, in the Z direction, inclination correction mechanism portion C1 is greater in dimension than connection portion C2 while inclination correction mechanism portion V1 is greater in dimension than connection portion V2. In FIG. 3, a width D2 in the X direction of a leading end 97 (the uppermost portion in the Z direction) of inclination correction mechanism portion V1 formed in heat sink 200 is greater than a width D1 in the X direction of a bottom portion 99 (the uppermost portion in the Z direction) of inclination correction mechanism portion C1 formed in metal component 4. Also in FIG. 4, a width D3 of an opening 95 (the lowermost portion in the Z direction) of inclination correction mechanism portion C1 in the X direction is (approximately) equal to a width D4 of a base portion 93 (the lowermost portion in the Z direction) of inclination correction mechanism portion V1 in the X direction. Also in FIG. 4, a width D6 of a leading end 97 of connection portion V2 formed in heat sink 200 in the X direction is greater than a width D5 of a bottom portion 99 of connection portion C2 in the X direction. This shows the relation that a slight plastic deformation occurs in the wall surfaces of the recess portion and the protrusion portion when metal component 4 and heat sink 200 are fixed to each other. Furthermore, in FIG. 4, a width D7 of opening 95 of connection portion C2 in the X direction is (approximately) equal to a width D8 of base portion 93 of connection portion V2 in the X direction.

Consequently, as to the inclination angle of the wall surface to the Z direction, an inclination angle IA3 of inclination correction mechanism portion C1 is greater than an inclination angle IA4 of inclination correction mechanism portion V1, and an inclination angle IA5 of connection portion C2 is greater than an inclination angle IA6 of connection portion V2. Also in FIG. 4, inclination angle IA3 of the wall surface of inclination correction mechanism portion C1 to the Z direction is (approximately) equal to inclination angle IA5 of the wall surface of connection portion C2 to the Z direction. In FIG. 4, inclination angle IA4 of inclination correction mechanism portion V1 in the Z direction is greater than inclination angle IA6 of connection portion V2, and connection portion V2 extends so as not to be inclined to the Z direction (extends along the Z direction) but not limited thereto.

In this case, inclination correction mechanism portion V1 and connection portion V2 are disposed so as to be located approximately at the same center positions in the X direction as inclination correction mechanism portion C1 and connection portion C2, respectively, that are disposed as described above, and so as to be capable of being fitted into inclination correction mechanism portion C1 and connection portion C2, respectively. Also in this case, inclination correction mechanism portion C1 and inclination correction mechanism portion V1 are approximately equal in height in the Z direction while connection portion C2 and connection portion V2 are also approximately equal in height in the Z direction.

Furthermore, in FIGS. 3 and 4, bottom portion 99 of inclination correction mechanism portion C1 and leading end 97 of inclination correction mechanism portion V1 each have a sharpened corner portion. However, this corner portion may be rounded. The same also applies to connection portions C2 and V2.

Then, a method of manufacturing semiconductor device 101 in the first example of the present embodiment will be hereinafter described with reference to FIGS. 5 to 8. Referring to FIGS. 5 and 6, a power module 100 is first prepared. Power module 100 includes a semiconductor element 1, an interconnection member 2 to which semiconductor element 1 is connected, an insulating layer 3 connected to interconnection member 2, a metal component 4 connected to interconnection member 2 with insulating layer 3 interposed therebetween, and a sealing member 5. Accordingly, metal component 4 is fixed to semiconductor element 1. Sealing member 5 seals semiconductor element 1, interconnection member 2, insulating layer 3, and a part of metal component 4 (an upper region in the Z direction in FIG. 1). At least a part (a lower region in the Z direction in FIG. 1) of metal component 4 is exposed from sealing member 5. Also, a heat sink 200 as a heat dissipation member connected to power module 100 is prepared.

Metal component 4 forming power module 100 is provided with one of (i) a plurality of recess portions and (ii) a plurality of protrusion portions while heat sink 200 is provided with the other of (i) a plurality of recess portions and (ii) a plurality of protrusion portions. In FIGS. 5 and 6, the lowermost portion of metal component 4 is provided with: an inclination correction mechanism portion C1 as the first recess portion that is a recess portion to be eventually included in the first protrusion-recess portion; and a connection portion C2 as the second recess portion that is a recess portion to be eventually included in the second protrusion-recess portion. Furthermore, the uppermost portion of heat sink 200 is provided with: an inclination correction mechanism portion V1 as the first protrusion portion that is a protrusion portion to be eventually included in the first protrusion-recess portion; and a connection portion V2 as the second protrusion portion that is a protrusion portion to be eventually included in the second protrusion-recess portion. These portions may be formed so as to extend along the Y direction as shown in FIG. 5.

When metal component 4 and heat sink 200 each are made of a metal material or an alloy material containing aluminum as a main component, metal component 4 and heat sink 200 having the recess portions and the protrusion portions, respectively, are formed by machining such as forging, die-casting, extrusion. In consideration of the productivity and the heat dissipation performance, it is more preferable that metal component 4 and heat sink 200 are formed by forging or extrusion.

It is preferable that inclination correction mechanism portions C1, V1 and connection portions C2, V2 are formed so as to have dimensions and shapes as shown in FIG. 4. Specifically, in the Z direction, inclination correction mechanism portion C1 is greater in dimension than connection portion C2 while inclination correction mechanism portion V1 is greater in dimension than connection portion V2. A pre-integration wall surface C10 of inclination correction mechanism portion C1 and a pre-integration wall surface V10 of inclination correction mechanism portion V1 each are an inclined surface that is inclined to the height direction. An inclination angle IA3 of pre-integration wall surface C10 is different from an inclination angle IA4 of pre-integration wall surface V10. Specifically, inclination angle IA3 of pre-integration wall surface C10 to the height direction is at least partially (entirely in FIG. 6) greater than inclination angle IA4 of pre-integration wall surface V10 to the height direction. It is preferable that inclination correction mechanism portion C1 is reduced in width between pre-integration wall surfaces C10 in the X direction toward the bottom portion (upward in the Z direction in the figure).

Also as described above, in FIG. 4, it is preferable that width D2 of leading end 97 of inclination correction mechanism portion V1 in the X direction is greater than width D1 of bottom portion 99 of inclination correction mechanism portion C1 in the X direction, and also that width D3 of opening 95 of inclination correction mechanism portion C1 in the X direction is greater than width D2 of leading end 97.

Referring to FIGS. 6, 7 and 8, the plurality of recess portions and the plurality of protrusion portions are fitted into each other to thereby form a plurality of protrusion-recess portions, so that metal component 4 and heat sink 200 are integrated with each other. Inclination correction mechanism portion C1 of metal component 4 and inclination correction mechanism portion V1 of heat sink 200 are moved to contact each other in the state where inclination correction mechanism portion C1 of metal component 4 and inclination correction mechanism portion V1 of heat sink 200 are disposed to face each other. Also, connection portion C2 of metal component 4 and connection portion V2 of heat sink 200 are moved to contact each other in the state where connection portion C2 of metal component 4 and connection portion V2 of heat sink 200 are disposed to face each other. Thereby, inclination correction mechanism portion C1 and inclination correction mechanism portion V1 are fitted into each other while connection portion C2 and connection portion V2 are fitted into each other. When these portions are fitted into each other, as shown in FIG. 7, for example, plate-shaped pressure applying means 20 is placed on power module 100, and then, pressing force F is applied downward in the Z direction to pressure applying means 20. Thereby, inclination correction mechanism portion C1 and inclination correction mechanism portion V1 fitted into each other are plastically deformed. Also, connection portion C2 and connection portion V2 fitted into each other are plastically deformed. When the surfaces of the recess portions and the protrusion portions are plastically deformed in this way, they are fitted and fixed to each other such that the metal surfaces that are newly exposed contact each other. In other words, through the so-called caulking by plastic deformation of metal materials, inclination correction mechanism portion C1 and inclination correction mechanism portion V1 are fixed to each other and connection portion C2 and connection portion V2 are fixed to each other, so as to provide firm fixed portion 10 (see FIG. 2).

In this case, when the plurality of recess portions and the plurality of protrusion portions are fitted into each other, inclination correction mechanism portion C1 and inclination correction mechanism portion V1 contact each other before connection portion C2 and connection portion V2 contact each other. In other words, particularly referring to FIG. 6, pre-integration wall surface C10 of inclination correction mechanism portion C1 and pre-integration wall surface V10 of inclination correction mechanism portion V1 contact each other before the wall surfaces of connection portion C2 and connection portion V2 contact each other. This can be implemented because: inclination correction mechanism portion C1 is greater in dimension in the Z direction than connection portion C2; inclination correction mechanism portion V1 is greater in dimension in the Z direction than connection portion V2; width D2 is greater than width D1 in FIG. 4, for example as described above; and the like. Furthermore, the plurality of inclination correction mechanism portions C1 and the plurality of connection portions C2 are formed to have the lowermost portions (openings) that are located approximately at the same position (height) in the Z direction. Also, the plurality of inclination correction mechanism portions V1 and the plurality of connection portions V2 are formed to have the lowermost portions (base portions) that are located approximately at the same position (height) in the Z direction. Accordingly, as shown in FIG. 4, bottom portion 99 of inclination correction mechanism portion C1 is disposed higher (deeper side) in the Z direction than the bottom portion of connection portion C2. Also, leading end 97 of inclination correction mechanism portion V1 is disposed upper (deeper side) in the Z direction than the leading end of connection portion V2. Thereby, pre-integration wall surface C10 and pre-integration wall surface V10 can contact each other in advance. Then, as inclination correction mechanism portion C1 and inclination correction mechanism portion V1 contact each other, at least one of inclination correction mechanism portion C1 and inclination correction mechanism portion V1 is plastically deformed. In other word, caulking progresses while inclination correction mechanism portion C1 and inclination correction mechanism portion V1 that contact each other are interfered with each other.

As described above, by processing of integrating metal component 4 and heat sink 200 with each other using pressing force F, a semiconductor device including first protrusion-recess portion CV1 and second protrusion-recess portion CV2 that are plastically deformed is formed as shown in FIG. 8. First protrusion-recess portion CV1 thus formed is greater in height direction dimension than second protrusion-recess portion CV2.

As described above, plastically deformed (caulked) firm fixed portion 10 may be formed on first wall surface portion S1 of first protrusion-recess portion CV1 as in an example in FIG. 2, but may be formed on second wall surface portion S2 below first wall surface portion S1 in the Z direction. For example, as in FIG. 4, in the case where width D2 of leading end 97 is greater than width D1 of bottom portion 99 and where width D3 of opening 95 is approximately equal to width D4 of base portion 93, particularly, width D2 of leading end 97 digs into narrow width D1 of recess portion C1 to achieve significant caulking after inclination correction mechanism portions C1 and V1 are fitted into each other. Thus, when the material having the dimensions in FIG. 4 is used, firm fixed portion 10 is more likely to be formed in a relatively upper portion on first wall surface portion S1 in the Z direction. In contrast, for example, in the case where width D4 is greater than width D3 in FIG. 4, particularly, base portion 93 digs into narrow width D3 to achieve significant caulking after inclination correction mechanism portions C1 and V1 are fitted into each other. Accordingly, firm fixed portion 10 is more likely to be formed in a relatively lower portion on second wall surface portion S2 in the Z direction.

Figure 9:
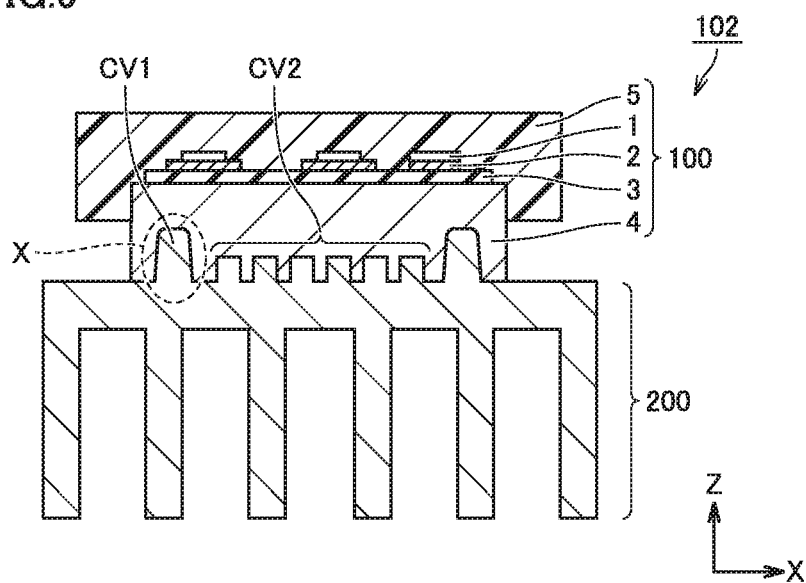
FIG. 9 is a schematic cross-sectional view showing the configuration of a semiconductor device according to the second example of the first embodiment.

Then, the configuration of a semiconductor device 102 in the second example of the present embodiment will be hereinafter described with reference to FIGS. 9 to 12. Referring to FIG. 9, semiconductor device 102 in the second example of the present embodiment has basically the same configuration as that of semiconductor device 101. Accordingly, in FIG. 9, the portions having the same configurations as those of semiconductor device 101 are designated by the same reference characters, and the description thereof will not be repeated. Semiconductor device 102 is different from semiconductor device 101 in the positional relation between first protrusion-recess portion CV1 and second protrusion-recess portion CV2. Specifically, in semiconductor device 102, one first protrusion-recess portion CV1 is disposed at each of the right and left ends in the X direction. Also, a plurality of (six) second protrusion-recess portions CV2 are disposed so as to be sandwiched between first protrusion-recess portions CV1 at the right and left ends. In other words, in semiconductor device 102, only one pair of first protrusion-recess portions CV1 is disposed such that second protrusion-recess portions CV2 are sandwiched therebetween. Thus, first protrusion-recess portion CV1 is formed as described above in the process of manufacturing semiconductor device 102. In this point, semiconductor device 102 is different from semiconductor device 101 configured such that one first protrusion-recess portion CV1 is disposed in the center portion in the X direction, and a plurality of (four) second protrusion-recess portions CV2 are disposed on each of the right and left sides of one first protrusion-recess portion CV1 so as to sandwich one first protrusion-recess portion CV1 therebetween.

Figure 10:
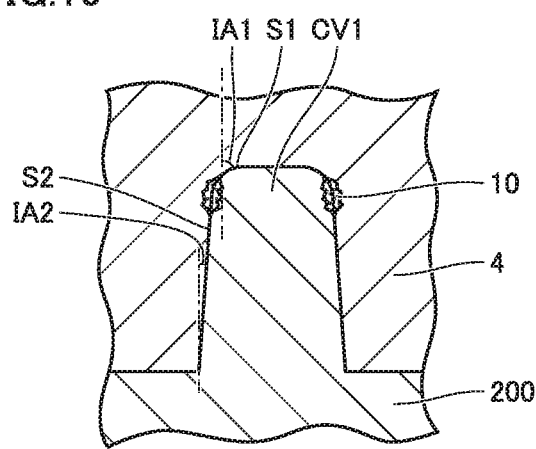
FIG. 10 is an enlarged schematic cross-sectional view of a region X surrounded by a dotted line in FIG. 9.

Referring to FIG. 10, the configuration of first protrusion-recess portion CV1 in semiconductor device 102 is basically the same as the configuration of first protrusion-recess portion CV1 in semiconductor device 101 shown in FIG. 6. Namely, referring to FIGS. 11 and 12, in semiconductor device 102, the shapes, the dimensions, the inclination angles and the like of inclination correction mechanism portion C1 and inclination correction mechanism portion V1 that form first protrusion-recess portion CV1 are basically set corresponding to those of semiconductor device 101. Specifically, for example, in FIG. 12, width D2 of leading end 97 of inclination correction mechanism portion V1 in the X direction is greater than width D1 of bottom portion 99 of inclination correction mechanism portion C1 in the X direction. In FIG. 12, width D3 of opening 95 (the lowermost portion in the Z direction) of inclination correction mechanism portion C1 in the X direction is (approximately) equal to width D4 of base portion 93 (the lowermost portion in the Z direction) of inclination correction mechanism portion V1 in the X direction. As a result, inclination correction mechanism portion C1 is greater in inclination angle of the wall surface in the Z direction than inclination correction mechanism portion V1. However, inclination angle IA3 of inclination correction mechanism portion C1 is greater than inclination angle IA5 of connection portion C2 while inclination angle IA4 of inclination correction mechanism portion V1 is greater than inclination angle IA6 of connection portion V2.

In FIGS. 11 and 12, the wall surfaces of connection portions C2 and V2 each are formed to extend in the direction along the Z direction, and not inclined. Namely, inclination angle IA5 of connection portion C2 and inclination angle IA6 of connection portion V2 are approximately zero. However, without being limited to this, for example, connection portion V2 and inclination correction mechanism portion V1 each may be configured to have a wall surface inclined at an (approximately) equal inclination angle to the Z direction. Furthermore, dimensions D5 to D8 exhibit the large-small relation such that at least connection portion V2 can be inserted into connection portion C2.

Figure 13:
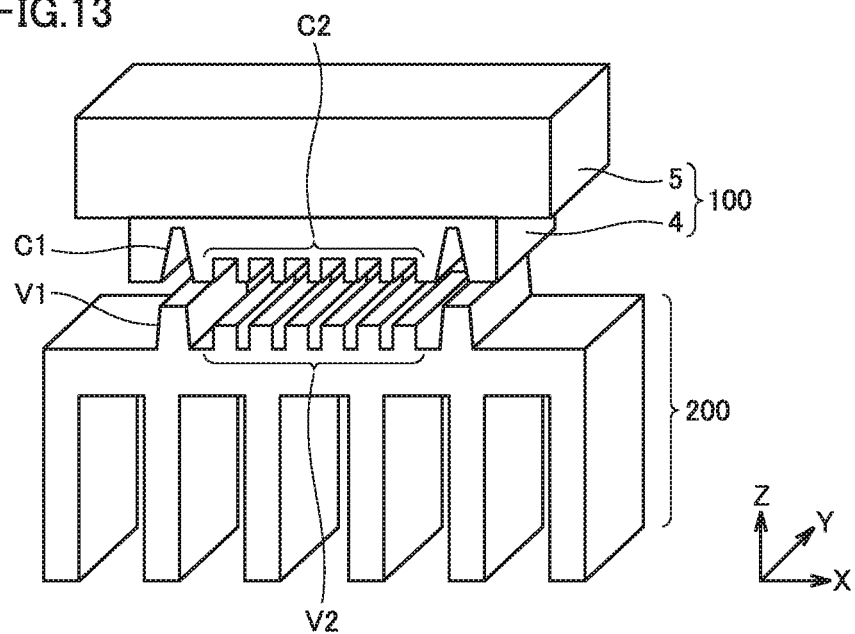
FIG. 13 is a schematic perspective view showing the first step of a method of manufacturing a semiconductor device according to the second example of the first embodiment.

Referring to FIG. 13, the shapes of power module 100 and heat sink 200 prepared when forming semiconductor device 102 shown in FIG. 9 are basically the same as power module 100 and the like prepared when manufacturing semiconductor device 101. In other words, as in power module 100 in FIG. 9, inclination correction mechanism portions C1, V1 and connection portions C2, V2 may be formed so as to extend along the Y direction also in power module 100 in FIG. 13. However, referring to FIG. 14, inclination correction mechanism portions C1, V1 and connection portions C2, V2 may be formed so as to be distributed in dot pattern or in a matrix shape in a plan view. Also in this case, the same functions and effects as those in the configuration in FIG. 13 can be expected.

Figure 15:
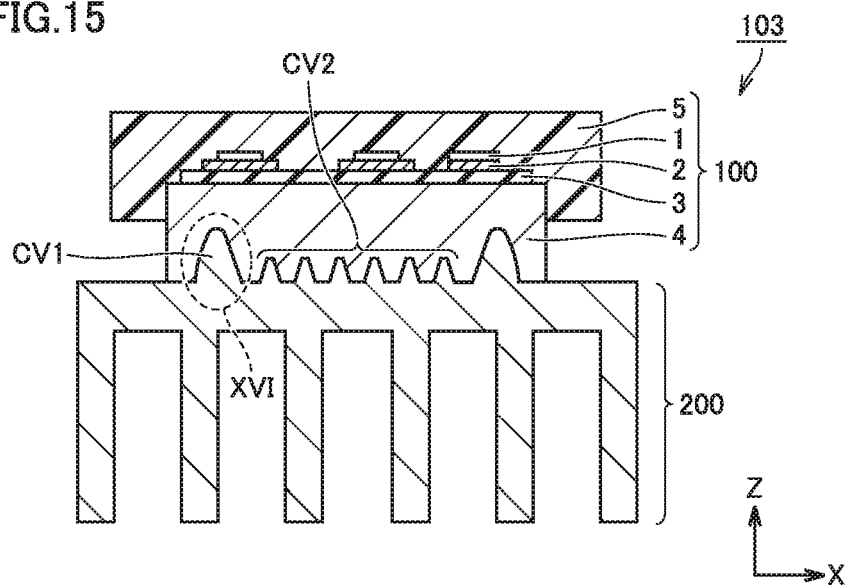
FIG. 15 is a schematic cross-sectional view showing the configuration of a semiconductor device according to the third example of the first embodiment.

Then, the configuration of a semiconductor device 103 in the third example of the present embodiment will be hereinafter described with reference to FIGS. 15 to 18. Referring to FIG. 15, semiconductor device 103 in the third example of the present embodiment is basically identical in configuration to semiconductor device 102. Accordingly, in FIG. 15, the portions having the same configurations as those of semiconductor device 102 are designated by the same reference characters, and the description thereof will not be repeated. Semiconductor device 103 is different from semiconductor device 102 in shape of the wall surface of first protrusion-recess portion CV1.

Figure 16:
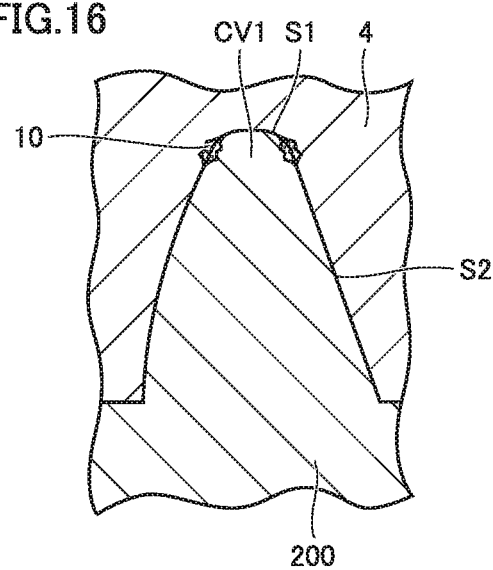
FIG. 16 is an enlarged schematic cross-sectional view of a region XVI surrounded by a dotted line in FIG. 15.

Referring to FIGS. 15 and 16, a pair of first protrusion-recess portions CV1 each has an inside surface, that is, a wall surface on the second protrusion-recess portion CV2 side, configured to include first wall surface portion S1 and second wall surface portion S2 in the same manner as in semiconductor devices 101 and 102. However, first protrusion-recess portion CV1 is configured to have a slightly curved wall surface on the outside in the X direction. In addition, firm fixed portion 10 is provided in the same manner as in semiconductor devices 101 and 102.

Figure 17:
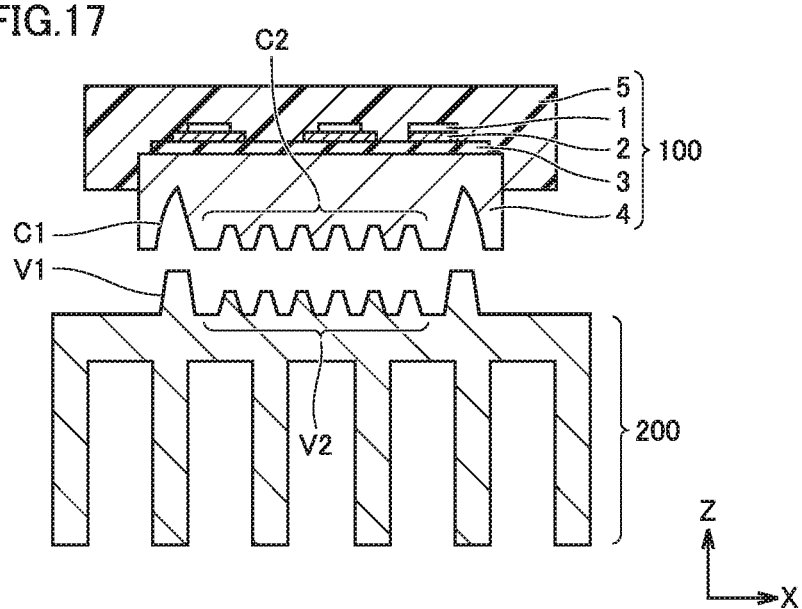
FIG. 17 is a schematic cross-sectional view showing the state of recess portions and protrusion portions formed in each of a metal component and a heat sink before integration of the metal component and the heat sink with each other, in the third example of the first embodiment.
Figure 18:
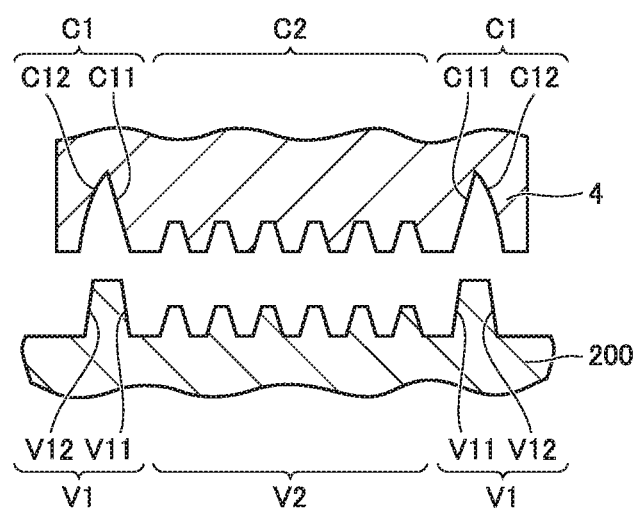
FIG. 18 is an enlarged schematic cross-sectional view showing dimensions and the like of each of the recess portions and the protrusion portions in FIG. 17.

Referring to FIGS. 17 and 18, when semiconductor device 103 is formed (before integration), the wall surface of inclination correction mechanism portion C1 that is not adjacent to connection portion C2, that is, located on the outer side in the figure, is formed as a curved surface. In other words, inclination correction mechanism portion C1 is configured such that a wall surface C11 adjacent to connection portion C2 and located on the inner side in the figure is formed in a plane shape, whereas a wall surface C12 not adjacent to connection portion C2, that is, located on the outer side in the figure, is formed in a curved shape. In addition, the wall surface of inclination correction mechanism portion V1 has: a planar wall surface V11 that can contact planar wall surface C11; and a planar wall surface V12 that can contact curved wall surface C12, as in the cases of semiconductor devices 101 and 102. As in semiconductor device 101, inclination correction mechanism portion V1 is inserted into inclination correction mechanism portion C1 so as to be caulked, and thereby deformed and firmly fixed thereto, so that first protrusion-recess portion CV1 is formed as shown in FIGS. 15 and 16.

Figure 14:
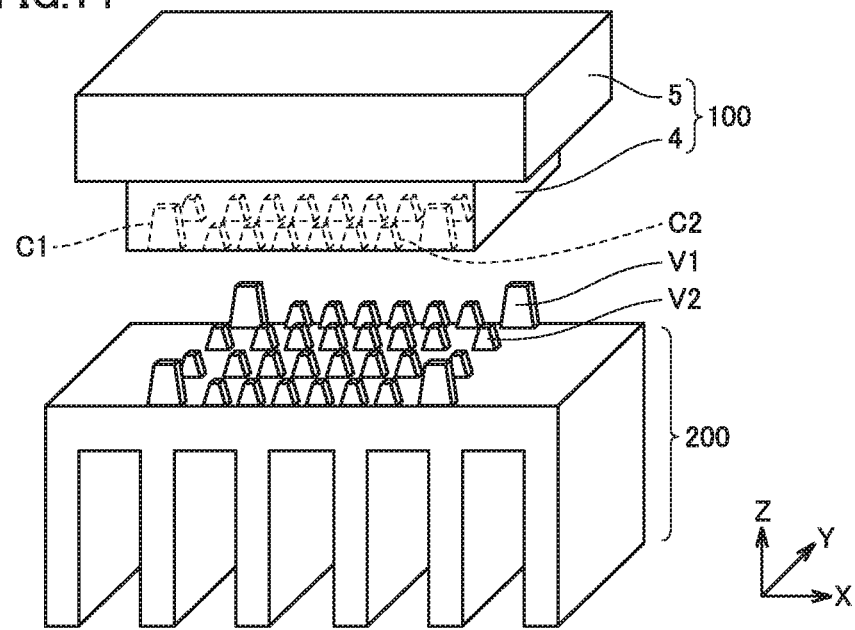
FIG. 14 is a schematic perspective view showing a modification of the first step of the method of manufacturing a semiconductor device according to the second example of the first embodiment.

Semiconductor device 103 is different from semiconductor device 102 in the inclination angle of the wall surface of second protrusion-recess portion CV2 and the inclination angles of the wall surfaces of connection portions C2 and V2 that form second protrusion-recess portion CV2 (the same also applies to the dot-patterned portion in FIG. 14). However, the inclination angles of second protrusion-recess portion and connection portions C2 and V2 forming thereof may be basically arbitrarily set. Namely, these inclination angles can be set at any angles as long as the thermal resistance of second protrusion-recess portion CV2 can be stabilized.

Then, the functions and effects of the present embodiment will be hereinafter described while explaining the background of the present invention.

In the process of manufacturing a semiconductor device including a power module and a heat sink, the connection portion having a protruded and recessed shape and formed in each of the metal component and the heat sink of the power module is formed by machining such as forging, die-casting, extrusion and the like. This causes dimension variations and position variations in the connection portion having a protruded and recessed shape. Thus, when the metal component and the heat sink are integrated with each other, it is difficult to accurately position the metal component and the heat sink so as not to cause position variations such as inclinations without using a special adjustment mechanism. If the metal component and the heat sink are integrated with each other without such an adjustment, the protrusion-recess portions may be fitted into each other in the state where the power module or the heat sink is inclined due to dimension variations and position variations occurring in the metal component and the heat sink during caulking.

If the caulking process is performed for the power module and the heat sink fitted into each other in the state where the power module or the heat sink is inclined, the power module and the heat sink are caulked in this inclined state upon application of the pressing force. This increases the thermal resistance in the connection portion between the power module and the heat sink, with the result that an installation failure may occur in the assembly step after caulking. Furthermore, when excessive pressing force equal to or greater than the maximum allowable force is applied for suppressing inclination, the sealing member may be broken.

On the other hand, in order to avoid the above-described failure for accurate positioning, it is conceivable that the position needs to be adjusted using a large-scale and complicated apparatus. However, this causes a problem that the productivity of the semiconductor device may decrease.

Thus, in the present embodiment, in the step of fitting a recess portion and a protrusion portion into each other and thereby integrating metal component 4 and heat sink 200 with each other to form a semiconductor device, first protrusion-recess portion CV1 including inclination correction mechanism portions C1 and V1 is greater in height direction dimension than second protrusion-recess portion CV2 including connection portions C2 and V2. The wall surfaces of inclination correction mechanism portions C1 and V1 are inclined to the height direction, and different in inclination angle from each other. Thus, in the integrating step, caulking progresses while inclination correction mechanism portion C1 and inclination correction mechanism portion V1 are interfered with each other.

Namely, the wall surface of inclination correction mechanism portion C1 is different in inclination angle from the wall surface of inclination correction mechanism portion V1. Thus, when inclination correction mechanism portion V1 is inserted into inclination correction mechanism portion C1, inclination correction mechanism portion V1 is blocked by inclination correction mechanism portion C1 before leading end 97 of the protrusion portion in inclination correction mechanism portion V1 contacts (is completely inserted into) bottom portion 99 (see FIG. 4) of the recess portion forming inclination correction mechanism portion C1. In other words, during the above-described insertion, wall surface V10 (see FIG. 6) of inclination correction mechanism portion V1 contacts wall surface C10 of inclination correction mechanism portion C1.

As described above, before leading end 97 contacts bottom portion 99 and the protrusion portion is completely inserted into the recess portion, inclination correction mechanism portion V1 is blocked by inclination correction mechanism portion C1, that is, inclination correction mechanism portion V1 and inclination correction mechanism portion C1 are temporarily positioned. In order to further enhance the above-described effect, in the present embodiment, inclination correction mechanism portions C1 and V1 contact each other before connection portions C2 and V2 contact each other. Then, by applying pressing force F, inclination correction mechanism portions C1 and V1 are adjusted to be positioned horizontal by their own inclination adjustment functions. Thereby, metal component 4 is positioned in the horizontal state relative to heat sink 200. By further applying pressing force F, while keeping the above-mentioned horizontal state, plastic deformation occurs in the regions of inclination correction mechanism portions C1 and V1 that are particularly close to bottom portion 99 and leading end 97, respectively, and also close to first wall surface portion S1, so that caulking is achieved. Then, connection portions C2 and V2 are also fitted into each other so as to be connected, thereby providing second protrusion-recess portion CV2.

In this way, pre-integration wall surface C10 of inclination correction mechanism portion C1 and pre-integration wall surface V10 of inclination correction mechanism portion V1 contact each other before connection portions C2 and V2 contact each other. Accordingly, inclination correction mechanism portions C1 and V1 serve to correct the inclination between them. In other words, even when power module 100 and heat sink 200 are not appropriately positioned, pressure is applied to power module 100 downward in the Z direction using pressure applying means 20, so that leading end 97 of inclination correction mechanism portion V1 contacts pre-integration wall surface C10 on one of the right and left sides of inclination correction mechanism portion C1 in the X direction. Then, power module 100 is pressed downward in the Z direction with pressing force F applied to pressure applying means 20. Thus, leading end 97 of inclination correction mechanism portion V1 is moved in the X direction along the tapered portion of pre-integration wall surface C10 of inclination correction mechanism portion C1 with which this leading end 97 comes into contact. It is more preferable that the adjustment mechanism is arranged such that the longitudinal direction of metal component 4 extends in the X direction since the inclination correction effect is further achieved.

It is preferable that the main surface of the upper member of metal component 4 of power module 100, that is, the upper and lower main surfaces of sealing member 5, is formed flat. This allows the following configuration to be achieved. Specifically, during application of pressure to power module 100 using pressure applying means 20, power module 100 and pressure applying means 20 can come into surface contact with each other, load can be applied in the perpendicular direction, and a horizontal movement can be implemented. Accordingly, it is preferable that a region contacting pressure applying means 20 is provided in the upper surface of sealing member 5 of power module 100, that is, the entire main surface of power module 100, and this region is formed as a flat surface. This flat surface does not necessarily have to extend over the entire main surface of power module 100. However, it is preferable, for example, to provide two regions: spaced at the same distance from the center point in the longitudinal direction of power module 100; and having upper surfaces formed as flat regions capable of contacting pressure applying means 20. In this way, pressure applying means 20 can come into contact with the flat surface with a smallest possible area. Also, both vertical pressurization and horizontal movement can be achieved. This is required due to the following reasons. Specifically, the entire main surface of power module 100 is generally provided with a region showing a model name, a lot number, a serial number, a design and the like. Thus, if the entire surface of power module 100 is formed as a region to be pressurized, a display area is to be provided on the side surface or the like, thereby complicating the step of providing displays, which is uneconomical.

Furthermore, inclination correction mechanism portions C1 and V1 each have a function of adjusting them to be flat. Thus, leading end 97 is moved in the X direction, so that metal component 4 is adjusted to be horizontal to heat sink 200. Further application of pressing force F causes plastic deformation in the regions of inclination correction mechanism portions C1 and V1 that are particularly close to bottom portion 99 and leading end 97, respectively, and also close to first wall surface portion S1 while maintaining the above-mentioned horizontal state, so that caulking is achieved. Then, connection portions C2 and V2 are also fitted into each other so as to be connected, thereby providing second protrusion-recess portion CV2.

Thereby, the position of power module 100 in the X direction is automatically set at a correct position uniquely relative to heat sink 200.

In other words, inclination correction mechanism portions C1 and V1 serve as positioning guides to uniquely determine the relative position between inclination correction mechanism portions C1 and V1 while contacting each other before connection portions C2 and V2 contact each other. Accordingly, by inclination correction mechanism portions C1 and V1, power module 100 can be automatically and highly accurately positioned relative to heat sink 200 without using a large-scale image examination device or precise positioning means, so that inclination of power module 100 can be suppressed. Thereby, integration by caulking is achieved with high positional accuracy without inclination and positional misalignment. The effect of enhancing the positional accuracy in this way is more significantly achieved in semiconductor device 102 including two inclination correction mechanism portions C1 and two inclination correction mechanism portions V1 than in semiconductor device 101 including only one inclination correction mechanism portion C1 and only one inclination correction mechanism portion V1.

Inclination correction mechanism portions C1 and V1 contact each other so as to be positioned before connection portions C2 and V2 contact each other, thereby causing connection portions C2 and V2 to be subsequently positioned with high accuracy. Accordingly, first protrusion-recess portion CV1 formed of inclination correction mechanism portions C1 and V1 and second protrusion-recess portion CV2 formed of connection portions C2 and V2 allow heat transport from power module 100 to heat sink 200 at a low thermal resistance value (high heat dissipation performance) without causing thermal resistance increase or variations. Also, pressing force F does not have to be excessively increased since the inclination can be suppressed. Accordingly, the reliability of the power module integrated with a heat sink as semiconductor devices 101 to 103 can be further improved.

In this way, since inclination correction mechanism portions C1 and V1 contact each other to function to correct the inclination and the position. Thus, as long as the conditions for the shapes and the dimensions of inclination correction mechanism portions C1 and V1 are satisfied, the shapes and the dimensional large-small relation of connection portions C2 and V2 may not particularly be problematic. Accordingly, it can be said that the shapes and the like of connection portions C2 and V2 only have to be taken into consideration as minimum as possible, so that the productivity may be able to be further improved.

Furthermore, in the present embodiment, it is preferable that width D2 of leading end 97 is greater than width D1 of bottom portion 99 while width D3 of opening 95 is greater than width D2 of leading end 97. It is also preferable that inclination angle IA3 of the wall surface of inclination correction mechanism portion C1 is (at least partially) greater than inclination angle IA4 of the wall surface of inclination correction mechanism portion V1, and that inclination correction mechanism portion C1 is reduced in width between the wall surfaces toward its bottom portion. By the configuration as described above, inclination correction mechanism portion V1 can be readily inserted into inclination correction mechanism portion C1. Furthermore, both tip ends of leading end 97 of inclination correction mechanism portion V1 can be brought into contact with the wall surfaces on both sides of inclination correction mechanism portion C1. As a result, inclination correction mechanism portions C1 and V1 can uniquely determine the relative position therebetween while contacting each other before connection portions C2 and V2 contact each other.

Furthermore, for example, inclination correction mechanism portion C1 forming semiconductor device 103 has a planar wall surface C11 and a curved wall surface C12. Thereby, first protrusion-recess portion CV1 also has a wall surface that is partially curved. In the present embodiment (third example), planar wall surface C11 has a function of position correction at the time when inclination correction mechanism portions C1 and V1 are fitted into each other. Specifically, even if the positions are displaced during the above-mentioned fitting, the leading end of inclination correction mechanism portion V1 slides in contact with wall surface C11 of inclination correction mechanism portion C1 formed as an inclined surface, so that positional misalignment can be corrected. Accordingly, only one surface in the X direction needs to be planar wall surface C11 contributing to positional misalignment correction, but the other surface in the X direction does not have to have a shape contributing to positional misalignment correction. Thus, particularly for the wall surface of inclination correction mechanism portion C1 that is not adjacent to connection portion C2, the shape conditions can be alleviated as compared with other portions. Therefore, it becomes possible to reduce the number of portions requiring consideration of the influence of the dimensional tolerance occurring during processing of inclination correction mechanism portion C1, so that the productivity may be able to be further improved.

In addition, the wall surface of first protrusion-recess portion CV1 of each of semiconductor devices 101 to 103 as finished products in the present embodiment includes first wall surface portion S1 having first inclination angle IA1 to the height direction, and second wall surface portion S2 having second inclination angle IA2 different from first inclination angle IA1. By analyzing each finished product to find out the above-mentioned features, it can be verified that each finished product is a corresponding one of semiconductor devices 101 to 103 formed by the manufacturing method in the present embodiment.

Furthermore, metal component 4 and heat sink 200 are different in hardness from each other. Thus, the load applied during caulking of metal component 4 and heat sink 200 can be adjusted. For example, application of excessive load can be suppressed.

For example, as in semiconductor devices 102 and 103, only one pair of first protrusion-recess portions CV1 is disposed so as to sandwich second protrusion-recess portion CV2 therebetween, that is, disposed in the end regions close to the end faces in the X direction in a plan view. Thereby, as compared with the case where a greater number of first protrusion-recess portions CV1 are provided, it becomes possible to further improve the effect of achieving first protrusion-recess portion CV1 by fitting of inclination correction mechanism portions C1 and V1 that are kept in the horizontal state.

Second Embodiment

Figure 19:
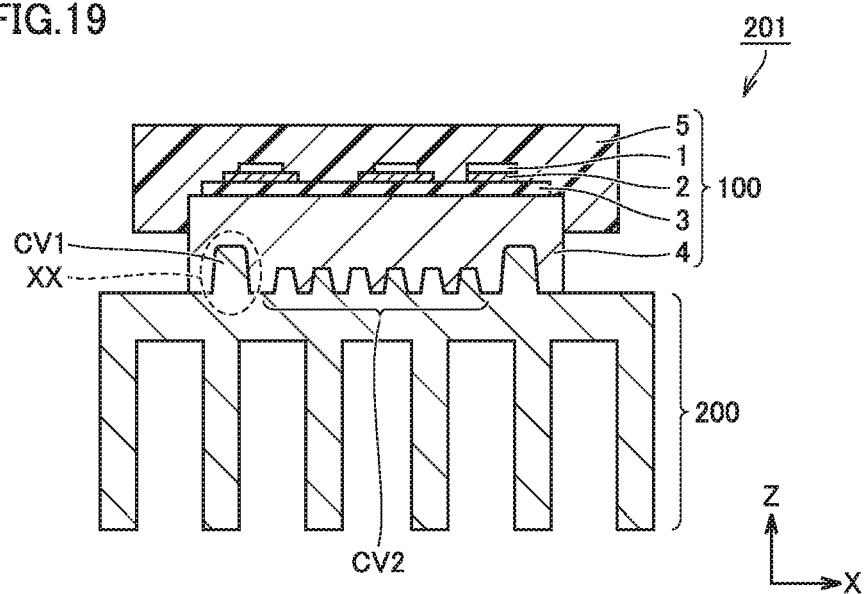
FIG. 19 is a schematic cross-sectional view showing the configuration of a semiconductor device according to the first example of the second embodiment.
Figure 20:
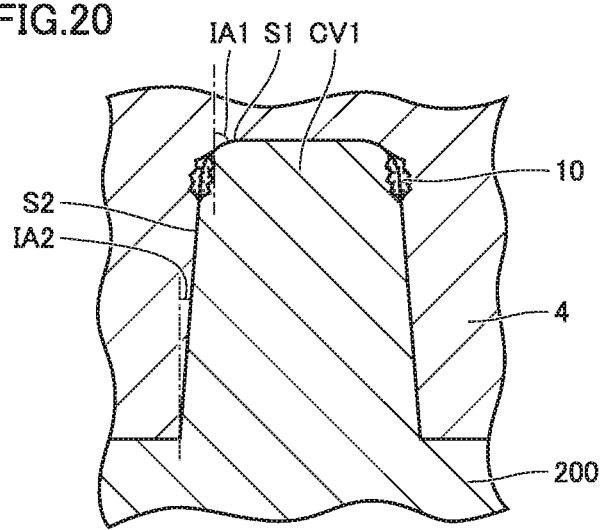
FIG. 20 is an enlarged schematic cross-sectional view of a region XX surrounded by a dotted line in FIG. 19.
Figure 21:
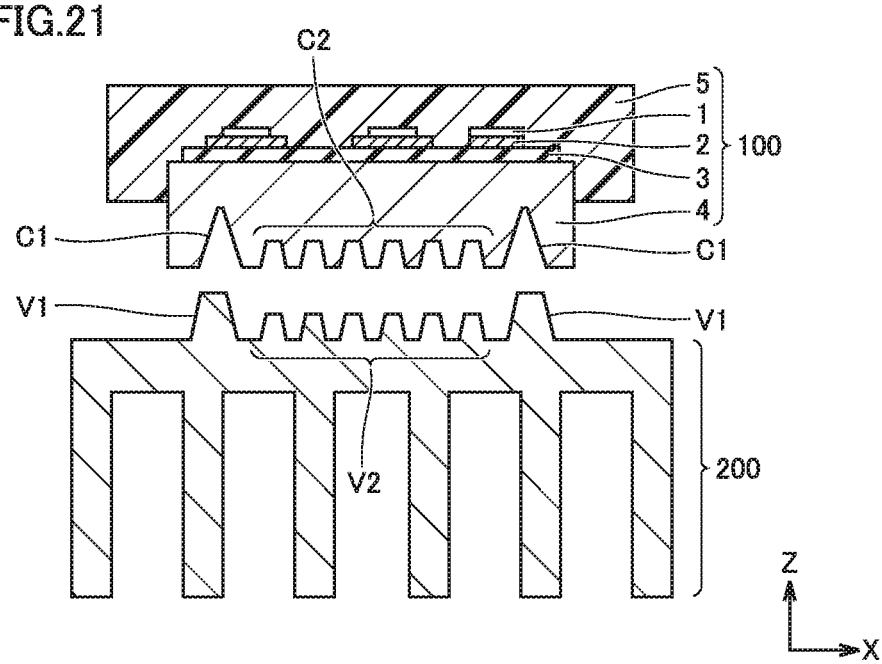
FIG. 21 is a schematic cross-sectional view showing the state of recess portions and protrusion portions formed in each of a metal component and a heat sink before integration of the metal component and the heat sink with each other, in the first example of the second embodiment.
Figure 22:
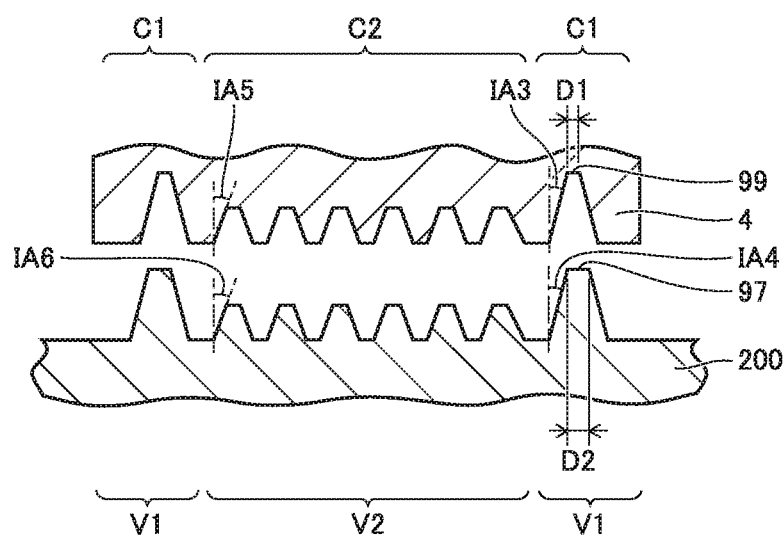
FIG. 22 is an enlarged schematic cross-sectional view showing dimensions and the like of each of the recess portions and the protrusion portions in FIG. 21.
Figure 23:
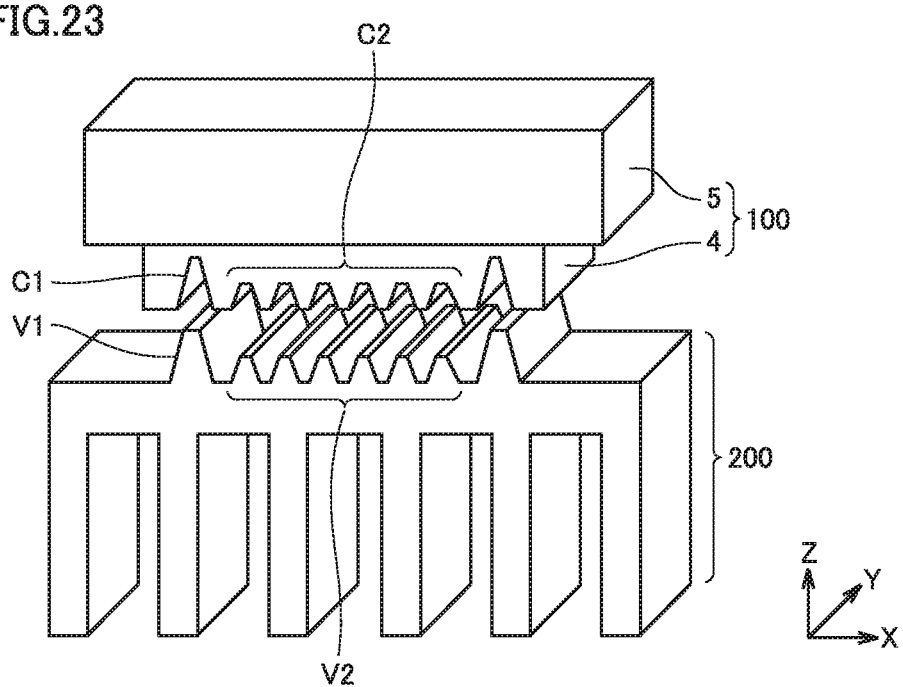
FIG. 23 is a schematic perspective view showing the first step of a method of manufacturing a semiconductor device according to the first example of the second embodiment.
Figure 24:
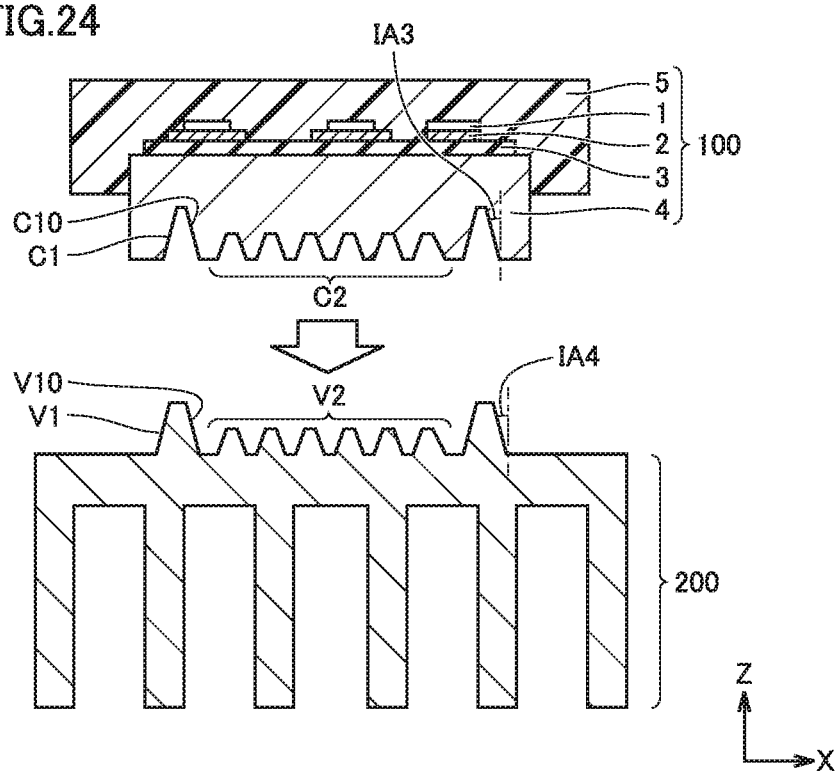
FIG. 24 is a schematic cross-sectional view showing the second step of the method of manufacturing a semiconductor device according to the first example of the second embodiment.

First, the configuration of a semiconductor device in the first example of the present embodiment will be described with reference to FIGS. 19 to 22. Referring to FIG. 19, a semiconductor device 201 in the first example of the present embodiment has basically the same configuration as that of semiconductor device 102. Accordingly, in FIG. 19, the portions having the same configurations as those of semiconductor device 102 are designated by the same reference characters, and the description thereof will not be repeated. Referring to FIGS. 19 and 20, semiconductor device 201 is different from semiconductor device 102 in first inclination angle IA1 and second inclination angle IA2 of first wall surface portion S1 and second wall surface portion S2, respectively, of first protrusion-recess portion CV1 to the Z direction, and also, in the inclination angle of the wall surface of second protrusion-recess portion CV2 to the Z direction.

First inclination angle IA1 and second inclination angle IA2 in FIG. 20 are smaller than first inclination angle IA1 and second inclination angle IA2 of semiconductor device 102 in FIG. 10. Also referring to FIGS. 21 and 22, inclination angle IA3 of inclination correction mechanism portion C1 that forms first protrusion-recess portion CV1 in semiconductor device 201 is greater than inclination angle IA4 of inclination correction mechanism portion V1. Furthermore, width D1 of bottom portion 99 of inclination correction mechanism portion C1 in the X direction is smaller than width D2 of leading end 97 of inclination correction mechanism portion V1 in the X direction.

In the present embodiment, inclination angle IA5 of connection portion C2 and inclination angle IA6 of connection portion V2 each have an angle other than zero. Also, the wall surfaces of connection portion C2 and connection portion V2 are inclined to the Z direction. Furthermore, inclination angle IA5 and inclination angle IA6 are different by several degrees.

Figure 25:
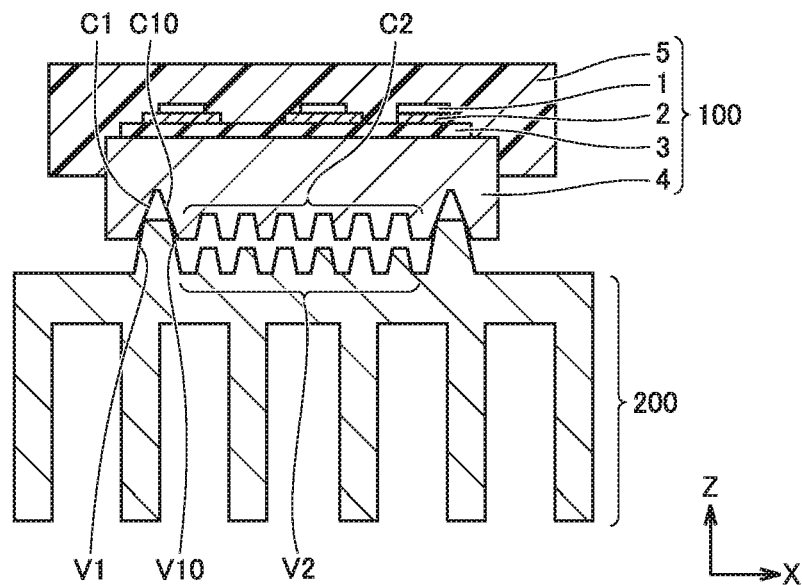
FIG. 25 is a schematic cross-sectional view showing the third step of the method of manufacturing a semiconductor device according to the first example of the second embodiment.
Figure 26:
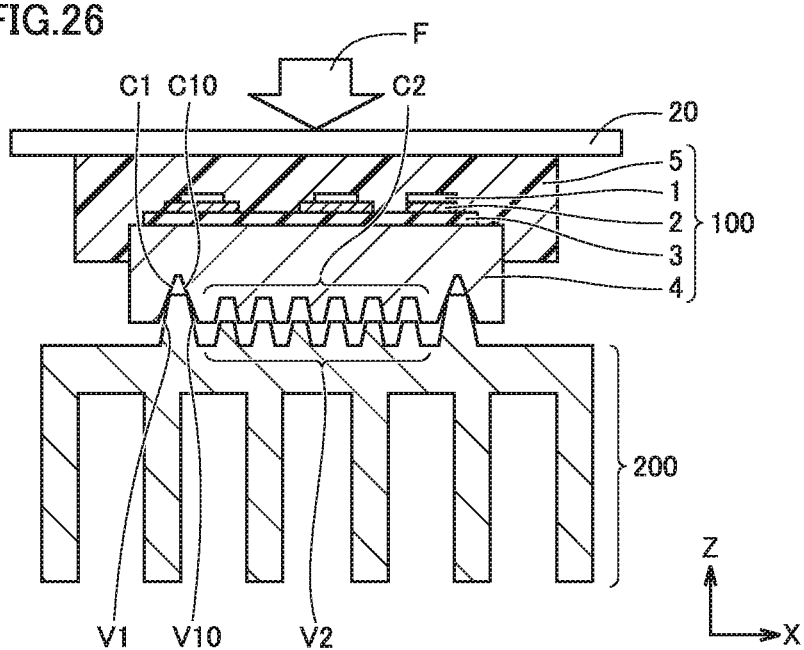
FIG. 26 is a schematic cross-sectional view showing the fourth step of the method of manufacturing a semiconductor device according to the first example of the second embodiment.
Figure 27:
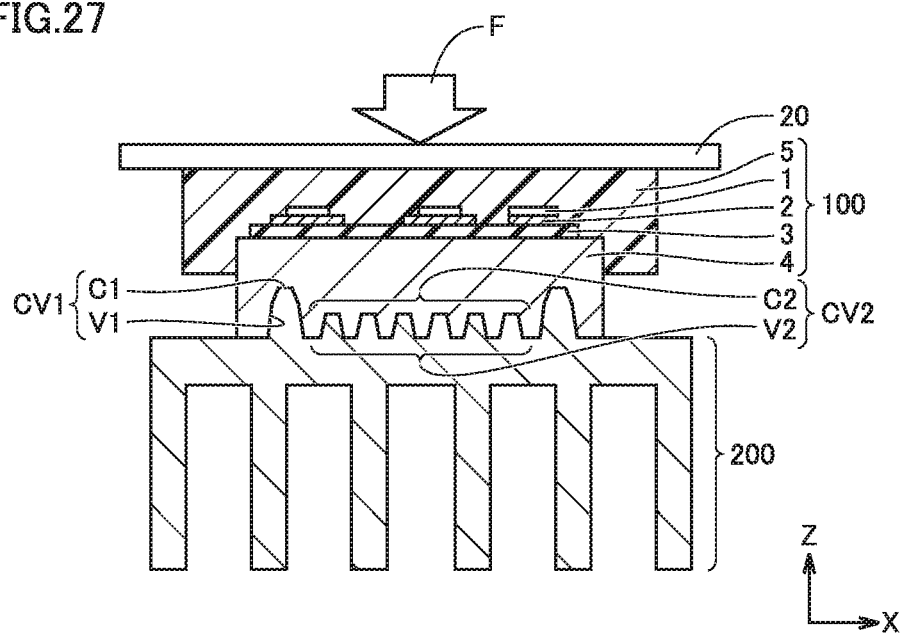
FIG. 27 is a schematic cross-sectional view showing the fifth step of the method of manufacturing a semiconductor device according to the first example of the second embodiment.

Referring to FIGS. 23 to 27, a method of manufacturing semiconductor device 201 is applied basically corresponding to each of the steps in FIGS. 5 to 8 showing the method of manufacturing semiconductor device 102 (101) in the first embodiment. Specifically, FIGS. 23 and 24 approximately correspond to FIG. 5; FIG. 25 approximately corresponds to FIG. 6; FIG. 26 approximately corresponds to FIG. 7; and FIG. 27 approximately corresponds to FIG. 8. However, FIGS. 23 to 27 are different from FIGS. 5 to 8 in: the dimensions such as inclination angles and widths of inclination correction mechanism portions C1 and V1; and the number of each of inclination correction mechanism portions C1 and V1. Thus, by conducting fitting and integrations using inclination correction mechanism portions C1, V1 and the like having the above-described shapes and dimensions, inclination correction mechanism portions C1 and V1 contact each other before connection portions C2 and V2 contact each other as in the first embodiment, so that inclination correction and positioning can be achieved.

Figure 28:
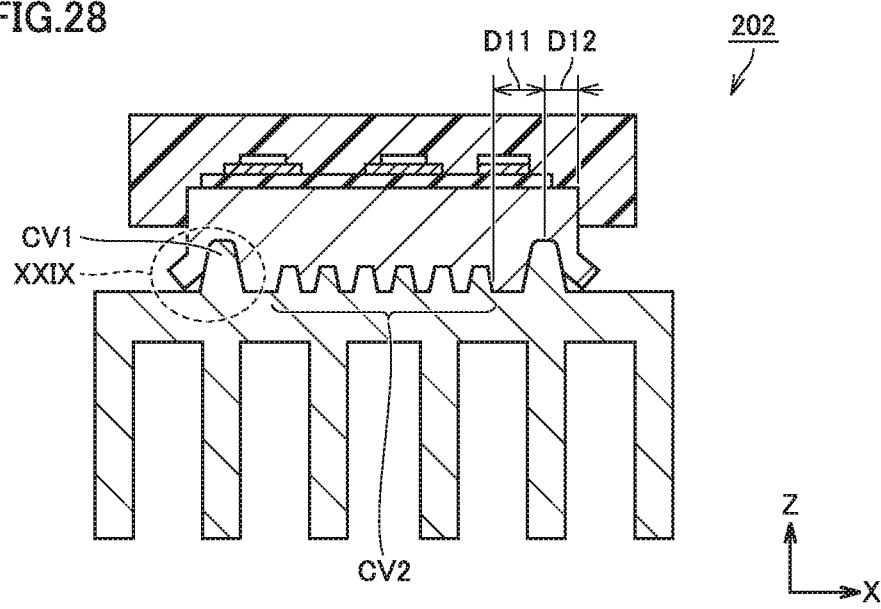
FIG. 28 is a schematic cross-sectional view showing the configuration of a semiconductor device according to the second example of the second embodiment.
Figure 29:
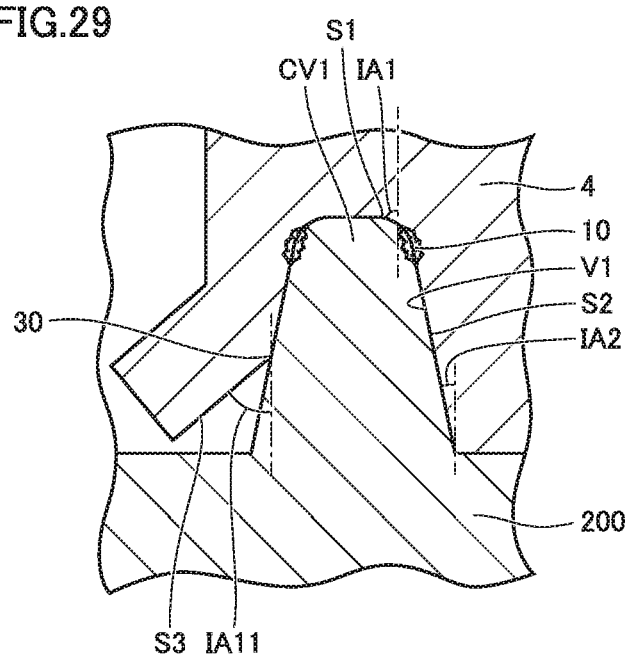
FIG. 29 is an enlarged schematic cross-sectional view of a region XXIX surrounded by a dotted line in FIG. 28.

Then, the configuration of a semiconductor device 202 in the second example of the present embodiment will be hereinafter described with reference to FIGS. 28 to 29. Referring to FIGS. 28 and 29, semiconductor device 202 in the second example of the present embodiment has basically the same configuration as that of semiconductor device 201. Accordingly, in FIGS. 28 and 29, the portions having the same configurations as those of semiconductor device 201 are designated by the same reference characters, and the description thereof will not be repeated. Semiconductor device 202 is different from semiconductor device 201 in the following points.

The following is an explanation about second protrusion-recess portion CV2 located closest to first protrusion-recess portion CV1 among second protrusion-recess portions CV2 arranged side by side in the X direction in FIG. 28. The distance extending in the X direction from the lowermost part of this second protrusion-recess portion CV2 located on the first protrusion-recess portion CV1 side to the center portion of first protrusion-recess portion CV1 adjacent thereto in the X direction is defined as D11. Also, the distance extending in the X direction from the center portion of first protrusion-recess portion CV1 in the X direction to the end face of metal component 4 adjacent thereto in the X direction is defined as D12. In this case, distance D12 is smaller than distance D11.

Metal component 4 is bent in an end face in the X direction and a region adjacent to this end face so as to be curved from a bent portion 30 as a starting point to the outside in the X direction. Bent portion 30 appears in the vicinity of the boundary between first protrusion-recess portion CV1 and metal component 4 where metal component 4 and heat sink 200 are integrated with each other, and means the starting point (the portion closest to the base portion) from which metal component 4 that should essentially extend in the Z direction extends so as to be inclined to the Z direction.

In the portion of first protrusion-recess portion CV1 that is not adjacent to bent portion 30 (on the right side in FIG. 29), first protrusion-recess portion CV1 includes: first wall surface portion S1 having first inclination angle IA1 to the Z direction and second wall surface portion S2 having second inclination angle IA2 different from first inclination angle IA1, as in semiconductor device 201. In contrast, in the portion at which metal component 4 is bent from bent portion 30, an inclination angle IA11 to the Z direction is great than these inclination angles IA1 and IA2. A third wall surface portion S3 having such a large inclination angle IA11 is a part of inclination correction mechanism portion C1. Accordingly, in this case, third wall surface portion S3 bent from bent portion 30 is also assumed to be included in first protrusion-recess portion CV1. Furthermore, metal component 4 is curved outward in the X direction in the region adjacent to the end face of metal component 4. Thereby, a gap is provided between the portion of metal component 4 that is curved outward and inclination correction mechanism portion V1 in the region below bent portion 30. The portion of this gap is also assumed to be included in first protrusion-recess portion CV1.

In semiconductor device 202, the wall surface of first protrusion-recess portion CV1 includes: first wall surface portion S1 having first inclination angle IA1; second wall surface portion S2 having second inclination angle IA2 different therefrom; and in addition, third wall surface portion S3 having inclination angle IA11 different from both of the above angles.

Figure 30:
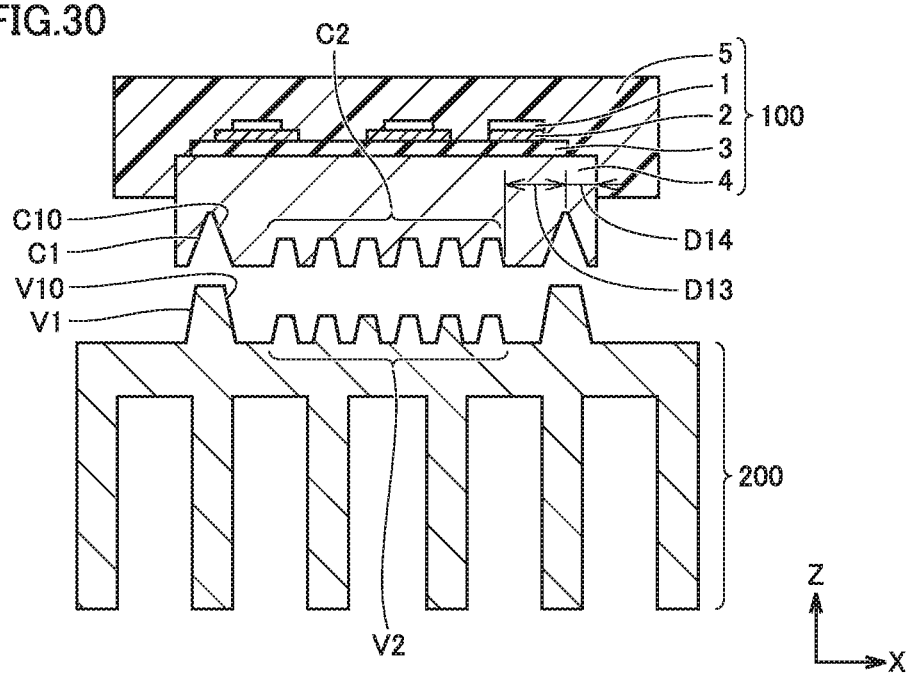
FIG. 30 is a schematic cross-sectional view showing the state of recess portions and protrusion portions formed in each of a metal component and a heat sink before integration of the metal component and the heat sink with each other, in the second example of the second embodiment.
Figure 31:
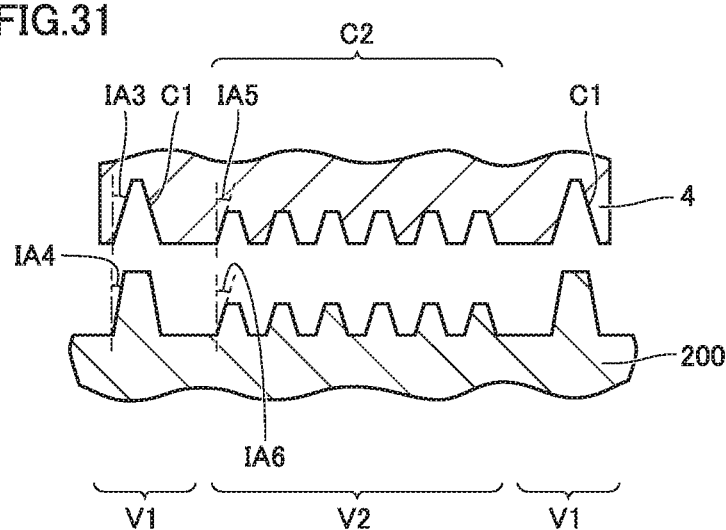
FIG. 31 is an enlarged schematic cross-sectional view showing dimensions and the like of each of the recess portions and the protrusion portions in FIG. 30.

Referring to FIGS. 30 to 31, the method of manufacturing semiconductor device 202 is applied basically corresponding to each of the steps in FIGS. 23 to 27 showing the method of manufacturing semiconductor device 201. However, the method of manufacturing semiconductor device 202 is different from the method of manufacturing semiconductor device 201 in the positional relation between inclination correction mechanism portions C1, V1 and connection portions C2, V2 that are respectively formed in power module 100 including metal component 4 and heat sink 200 connected thereto.

The following is an explanation about connection portion C2 closest to inclination correction mechanism portion C1 among connection portions C2 arranged side by side in the X direction in FIG. 30. The distance extending in the X direction from the lowermost part of this connection portion C2 located on the inclination correction mechanism portion C1 side to the center portion of inclination correction mechanism portion C1 adjacent thereto in the X direction is defined as D13. Also, the distance extending in the X direction from the center portion of inclination correction mechanism portion C1 in the X direction to the end face of metal component 4 adjacent thereto in the X direction is defined as D14. In this case, distance D14 is smaller than distance D13. Also, the plurality of inclination correction mechanism portions V1 and the plurality of connection portions V2 are arranged so as to be located approximately at the same position in the center portion in the X direction as those of the plurality of inclination correction mechanism portions C1 and the plurality of connection portions C2, respectively, arranged as described above, and also so as to be capable of being fitted into inclination correction mechanism portions C1 and connection portions C2, respectively.

After inclination correction mechanism portions C1, V1 and connection portions C2, V2 are prepared so as to satisfy the conditions for the dimensions as described above, first protrusion-recess portion CV1 and second protrusion-recess portion CV2 are formed by the method of applying the same pressing force as those in the first embodiment and the like. Then, metal component 4 and heat sink 200 are integrated with each other by caulking. In this case, a further outer region of first protrusion-recess portion CV1 that is disposed on each of the right and left ends in the X direction is bent by the pressing force so as to extend outward from bent portion 30.

In this case, when manufacturing semiconductor device 202, it is preferable to adjust the materials of metal component 4 and heat sink 200 such that the member provided with protrusion portions is higher in hardness than the member provided with recess portions. In this case, since recess portions are formed in metal component 4 while protrusion portions are formed in heat sink 200, heat sink 200 is formed to be higher in hardness than metal component 4. In this way, upon application of pressing force, metal component 4 is deformed more preferentially than heat sink 200, so that metal component 4 is more likely to be bent outward in the X direction. This can minimize the influence of inclination correction mechanism portions C1 and V1 upon the reliability and the like of caulking in connection portions C2 and V2. Thereby, the effect of suppressing the inclination of metal component 4 and the like can be further enhanced.

Figure 32:
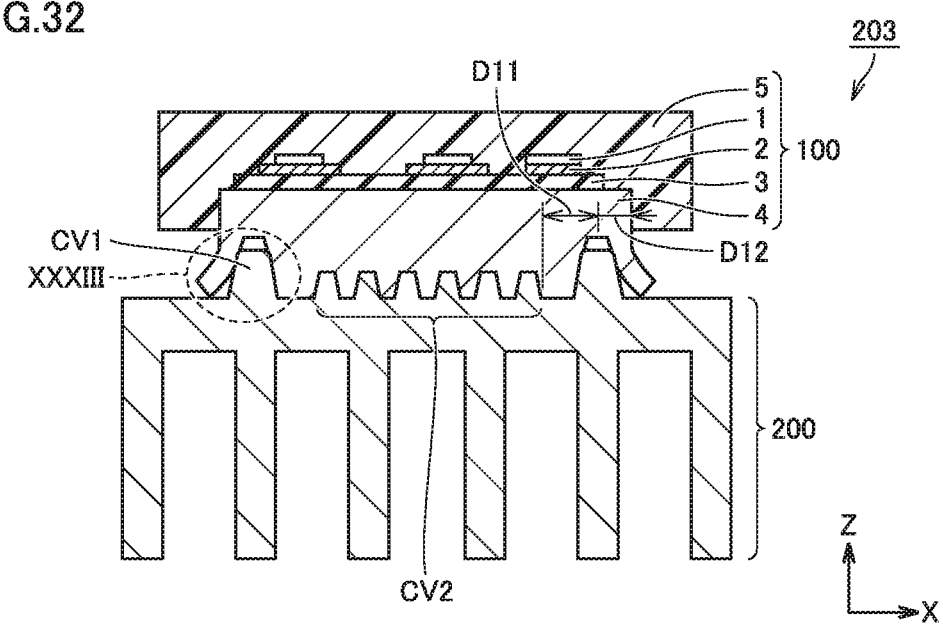
FIG. 32 is a schematic cross-sectional view showing the configuration of a semiconductor device according to the third example of the second embodiment.
Figure 33:
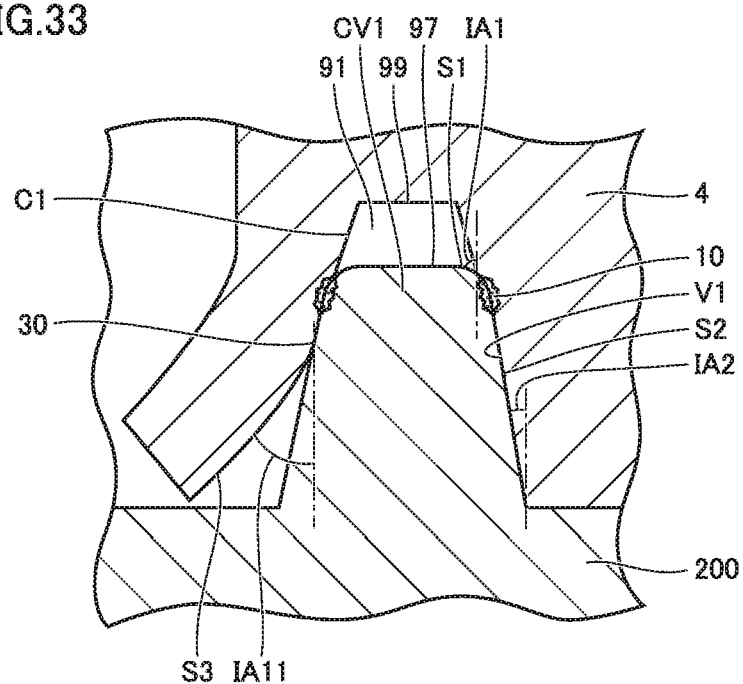
FIG. 33 is an enlarged schematic cross-sectional view of a region XXXIII surrounded by a dotted line in FIG. 32.

Then, the configuration of a semiconductor device 203 in the third example of the present embodiment will be hereinafter described with reference to FIGS. 32 and 33. Referring to FIGS. 32 and 33, semiconductor device 203 in the third example of the present embodiment has basically the same configuration as that of semiconductor device 202. Accordingly, in FIGS. 32 and 33, the portions having the same configurations as those of semiconductor device 202 are designated by the same reference characters, and the description thereof will not be repeated. Semiconductor device 203 is different from semiconductor device 202 in that a gap 91 is provided in the uppermost part of first protrusion-recess portion CV1 in the Z direction, that is, between bottom portion 99 of inclination correction mechanism portion C1 in metal component 4 and leading end 97 as the uppermost part of inclination correction mechanism portion V1 in the Z direction.

Gap 91 is formed by inclination correction mechanism portion C1. Thus, it is assumed that gap 91 and inclination correction mechanism portion C1 located directly thereabove are also included in first protrusion-recess portion CV1. Also in semiconductor device 203, first protrusion-recess portion CV1 includes third wall surface portion S3 bent from bent portion 30 and the gap between the portion of metal component 4 that is curved outward and inclination correction mechanism portion V1, as in semiconductor device 202.

As described later, in semiconductor device 203, first protrusion-recess portion CV1 may be provided with not so large firm fixed portion 10 by caulking. In semiconductor device 203, the wall surface of first protrusion-recess portion CV1 includes, as inclination correction mechanism portion C1 in a portion of gap 91, first wall surface portion S1 having first inclination angle IA1, second wall surface portion S2 having second inclination angle IA2 different therefrom and formed as a wall surface of the integrated region, and in addition, third wall surface portion S3 having inclination angle IA11 different from these angles. Second wall surface portion S2 is formed of inclination correction mechanism portion C1 and inclination correction mechanism portion V1 that are integrated with each other. In this case, second inclination angle IA2 is smaller than first inclination angle IA1, for example. In contrast, inclination angle IA11 is larger than first inclination angle IA1, for example.

Figure 34:
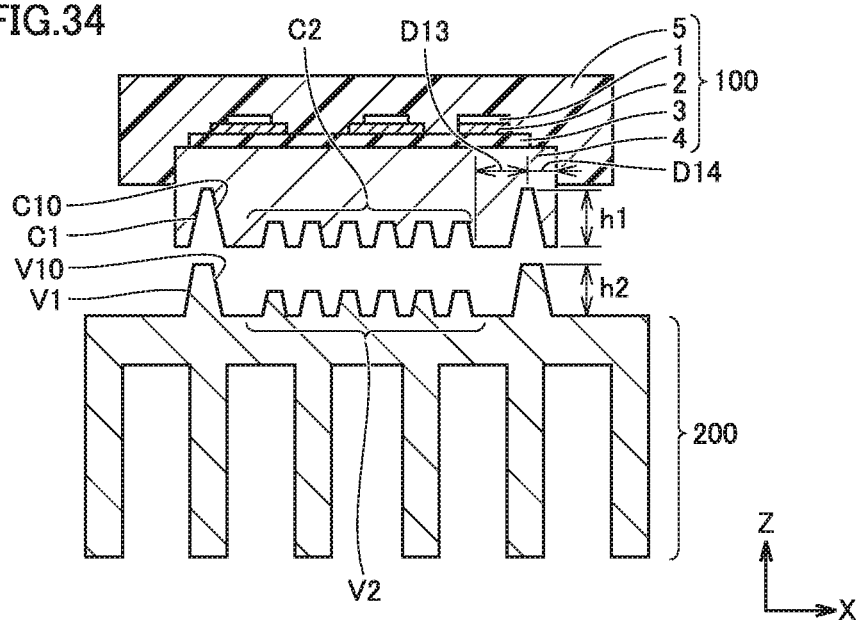
FIG. 34 is a schematic cross-sectional view showing the state of recess portions and protrusion portions formed in each of a metal component and a heat sink before integration of the metal component and the heat sink with each other, in the third example of the second embodiment.
Figure 35:
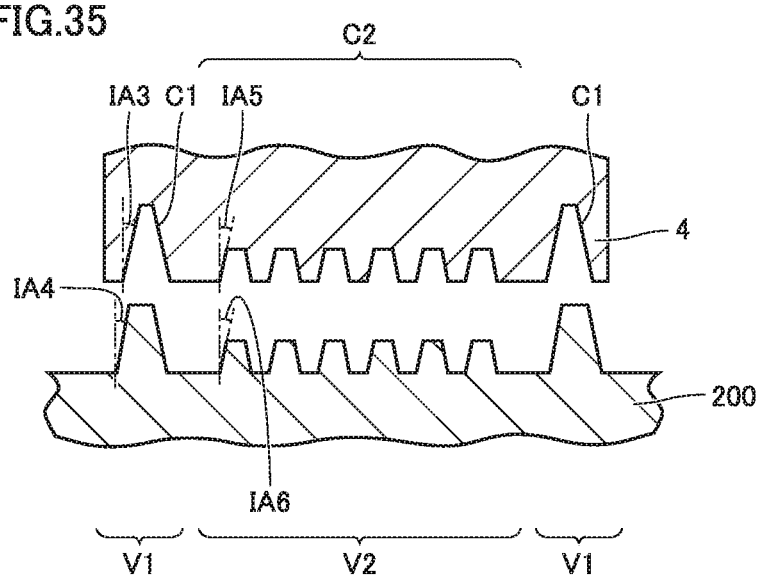
FIG. 35 is an enlarged schematic cross-sectional view showing dimensions and the like of each of the recess portions and the protrusion portions in FIG. 34.

Referring to FIGS. 34 and 35, the method of manufacturing semiconductor device 203 is applied basically corresponding to each of the steps in FIGS. 30 and 31 showing the method of manufacturing semiconductor device 202. Also in this case, it is preferable to adjust the materials of metal component 4 and heat sink 200 such that heat sink 200 provided with protrusion portions is higher in hardness than metal component 4 provided with recess portions. In this case, a height direction dimension h1 of inclination correction mechanism portion C1 having a recessed shape is higher than a height direction dimension h2 of inclination correction mechanism portion V1 having a protruding shape. Thus, inclination correction mechanism portions C1 and V1 are formed in such a manner in the process of manufacturing semiconductor device 203. In this point, each of the steps in FIGS. 34 and 35 is different from each of the steps in FIGS. 30 and 31 where both heights are approximately equal. This prevents the leading end of inclination correction mechanism portion V1 from contacting the bottom portion of inclination correction mechanism portion C1. Thereby, gap 91 as shown in FIG. 33 is formed. Accordingly, it becomes possible to suppress the influence of the tolerance in the Z direction in first protrusion-recess portion CV1.

Gap 91 also achieves the following effect. The step of manufacturing heat sink 200 and metal component 4 involves die-casting and machining. In the case of die-casting, fine metal powder may adhere to the surface to be processed. Also in the case of machining, chippings produced by machining may adhere to the surface to be processed. Existence of foreign substances such as metal powder or chippings may cause a problem that the adhesiveness between the wall surfaces forming first protrusion-recess portion CV1 may be impaired. The metal materials forming heat sink 200 and metal component 4 can be plastically deformed. Thus, the region contacting the foreign substance in heat sink 200 and metal component 4 is deformed, so that the wall surfaces forming first protrusion-recess portion CV1 may be able to contact each other to some extent. However, depending on the sizes of the foreign substances, there may be a possibility that the wall surfaces forming first protrusion-recess portion CV1 cannot be completely brought into close contact with each other. In contrast, due to gap 91, the foreign substances slide along the wall surfaces forming first protrusion-recess portion CV1 so as to be moved into gap 91 when these wall surfaces are brought into contact with each other. Thereby, gap 91 allows the wall surfaces forming first protrusion-recess portion CV1 to be firmly secured.

The functions and effects of the present embodiment will then be described.

Also in the present embodiment, inclination correction mechanism portions C1 and V1 contact each other before connection portions C2 and V2 contact each other, and leading end 97 of inclination correction mechanism portion V1 moves in the X direction along the tapered portion of pre-integration wall surface C10 in inclination correction mechanism portion C1, as in the first embodiment. Thereby, inclination suppression and accurate positioning can be achieved.

However, for example, when first inclination angle IA1 and second inclination angle IA2 are relatively large as in semiconductor device 201 in the first example, the pressing force required for completely caulking connection portions C2 and V2 is to be increased.

Thus, distance D12 (D14) is set to be smaller than distance D11 (D13), for example, as in semiconductor device 202 in the second example. Thus, the portion located on the outside of inclination correction mechanism C1 in the X direction is bent outward, thereby allowing the rigidity to be reduced, so that the pressing force can be leaked to the outside.

In this case, upon application of pressing force, the portion of inclination correction mechanism portion C1 that is not adjacent to connection portion C2 (on the outside in the X direction) is readily plastically deformed. When inclination correction mechanism portion C1 and inclination correction mechanism portion V1 are fitted into each other in order to correct the inclination of metal component 4, which is then further pressurized to thereby caulk connection portion C2 and connection portion V2, there may be problems that connection portion C2 and connection portion V2 are blocked, inclined or deformed in an unintentional manner. The above-mentioned problems can be suppressed by leaking the pressing force to the outside in the X direction, so that the heat dissipation performance deterioration resulting from inclination or the like of second protrusion-recess portion CV2 formed of connection portion C2 and connection portion V2 can be suppressed.

Furthermore, for example, as in semiconductor device 203 in the third example, inclination correction mechanism portion C1 is formed to be greater in height direction dimension than inclination correction mechanism portion V1. Thereby, first protrusion-recess portion CV1 as a finished product is configured to have gap 91 between itself and bottom portion 99 of inclination correction mechanism portion C1, or even when such a gap 91 is not provided, brought into such a contact state that plastic deformation is hardly caused by pressing force. Namely, in this case, even when caulking is caused to progress in the integration step, not so large firm fixed portion 10 may be formed by caulking.

The above-described configuration can reduce the influence exerted upon second protrusion-recess portion CV2 by inclination correction mechanism portions C1, V1 and first protrusion-recess portion CV1 formed thereof during caulking of connection portions C2 and V2 for forming second protrusion-recess portion CV2. Accordingly, for example, as in semiconductor device 103 in the first embodiment, the shape of the wall surface only on one side of inclination correction mechanism portion C1 in the X direction may be controlled, but the wall surface on the other side can be formed in any shape including a curved surface. This increases the flexibility of the shape of inclination correction mechanism portion C1. Thus, for example, by an R shaped portion formed in inclination correction mechanism portion C1 by machining, it becomes possible to suppress the problem that inclination correction mechanism portion V1 inserted thereinto is blocked, inclined or deformed in an unintentional manner. In other words, it becomes possible to reduce the possibility that first protrusion-recess portion CV1 may be influenced by the tolerance caused during processing for forming inclination correction mechanism portions C1 and V1.

In the present embodiment, inclination angle IA5 of connection portion C2 and inclination angle IA6 of connection portion V2 are different by several degrees from each other. In this way, by plastic deformation of connection portions C2 and V2 during caulking of these connection portions C2 and V2, the strength and the thermal resistance of second protrusion-recess portion CV2 can be controlled to be set at desired values. In the present embodiment, by increasing the number of second protrusion-recess portions CV2 or reducing the distance between second protrusion-recess portions CV2 adjacent to each other, the connection strength between metal component 4 and heat sink 200 in second protrusion-recess portion CV2 can be increased.

Furthermore, when metal component 4 and heat sink 200 are coupled through greaseless connection by caulking as in the present embodiment, it is a challenging task to reduce the thermal contact resistance produced in the connection portion therebetween. Generally, it is known that the thermal contact resistance depends on the contact pressure applied to the contact surface and the contact area. In the present embodiment, it was confirmed that the contact pressure applied to the contact surface is in correlation with the strength of the contact portion. Accordingly, by changing the number of connection portions C2 and V2 and changing the distance between connection portions C2 and V2, the thermal contact resistance can be reduced while high contact strength can be ensured. Also in the present embodiment, it is only necessary to satisfy the conditions that inclination correction mechanism portions C1 and V1 contact each other before connection portions C2 and V2 contact each other in the fitting step. By the method of forming metal component 4 and heat sink 200 and by the conditions for the allowable load to metal component 4 and heat sink 200, the dimensions and the shapes of connection portions C2 and V2 may be changed as appropriate such that desired connection strength and thermal resistance can be implemented.

By way of example, the height of each of connection portions C2 and V2 in the Z direction is set at 2 mm; the height of inclination correction mechanism portion C1 in the Z direction is set at 4 mm; and the height of inclination correction mechanism portion V1 in the Z direction is set at 3.5 mm. Furthermore, inclination angle IA3 of inclination correction mechanism portion C1 is set at 8.6°; inclination angle IA4 of inclination correction mechanism portion V1 is set at 8.0°; width D3 of opening 95 in inclination correction mechanism portion C1 (see FIG. 4) is set at 2.9 mm; and width D4 of base portion 93 in inclination correction mechanism portion V1 (see FIG. 4) is set at 3.0 mm. In this case, it could be confirmed that the thermal resistance of about 30 µm of a heat conductive grease at 1.0 W/m·K could be implemented in each of first protrusion-recess portion CV1 and second protrusion-recess portion CV2. It is to be noted that the thermal resistance is not always uniquely determined at the above-described value, but a wide range of thermal resistance value required in terms of design can be implemented by changing the height, the number and the like of the protrusion-recess structure of each of connection portions C2 and V2.

Third Embodiment

Figure 36:
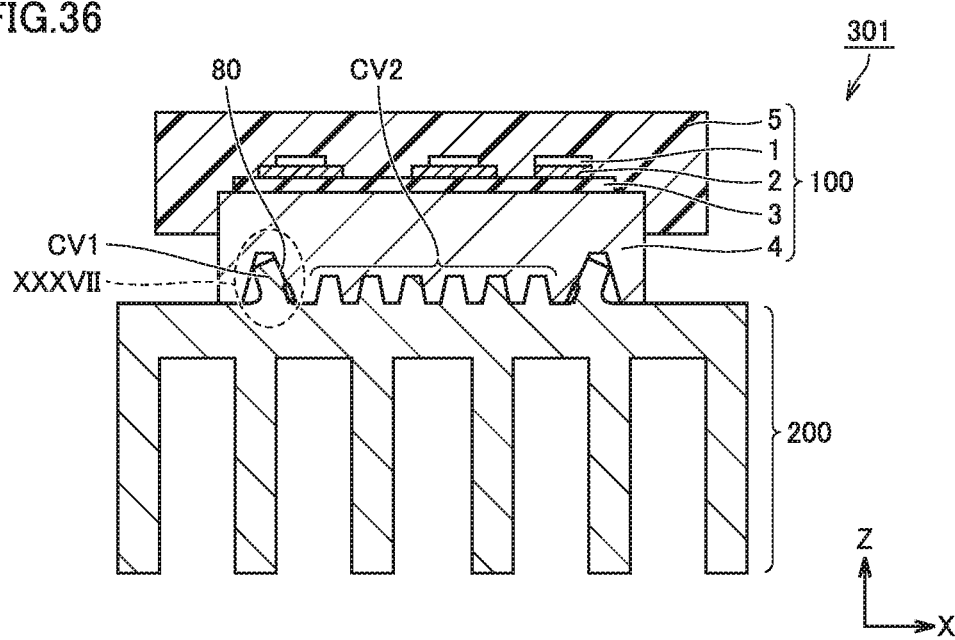
FIG. 36 is a schematic cross-sectional view showing the configuration of a semiconductor device according to the first example of the third embodiment.
Figure 37:
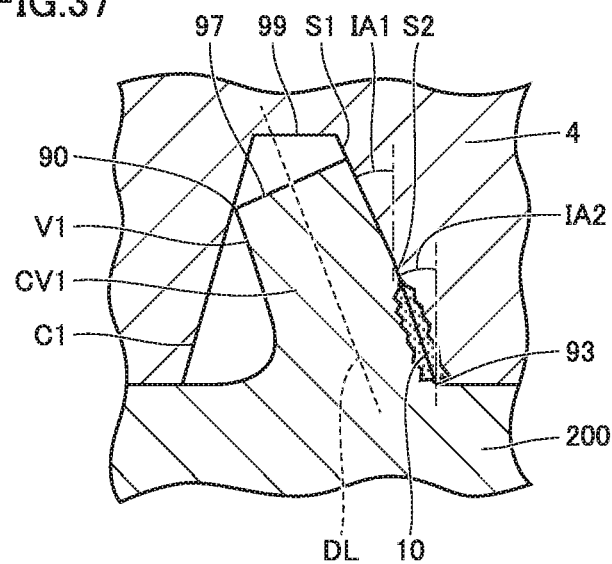
FIG. 37 is an enlarged schematic cross-sectional view of a region XXXVII surrounded by a dotted line in FIG. 36.

First, the configuration of the semiconductor device in the first example of the present embodiment will be described with reference to FIGS. 36 to 39. Referring to FIG. 36, a semiconductor device 301 in the first example of the present embodiment has basically the same configuration as those of semiconductor devices 102 and 201. In this case, only one pair of first protrusion-recess portions CV1 is disposed such that a plurality of second protrusion-recess portions CV2 are sandwiched therebetween in the X direction. Accordingly, in FIG. 36, the portions having the same configurations as those of semiconductor devices 102 and 201 are designated by the same reference characters, and the description thereof will not be repeated. Referring to FIGS. 36 and 37, semiconductor devices 301 is greatly different in shape of first protrusion-recess portion CV1 from semiconductor devices 102 and 201.

In the present embodiment, metal component 4 is provided with connection portion C2 as a plurality of recess portions, and inclination correction mechanism portion C1 as a plurality of other recess portions. Heat sink 200 is provided with inclination correction mechanism portion V1 and connection portion V2 each as a plurality of protrusion portions. However, on the other hand, metal component 4 may be provided with a plurality of protrusion portions while heat sink 200 may be provided a plurality of recess portions and other recess portions. An outer inclined surface portion 80 is included in inclination correction mechanism portion C1 as other recess portions. Outer inclined surface portion 80 is formed to face outward in the X direction and inclined to the Z direction. In other words, outer inclined surface portion 80 is a part of the wall surface forming inclination correction mechanism portion C1.

Referring to FIG. 37, in semiconductor device 301, a pair of first protrusion-recess portions CV1 disposed to be spaced apart from each other in the X direction each includes inclination correction mechanism portion V1 as one pair of protrusion portions. This inclination correction mechanism portion V1 extends from its base portion 93 toward leading end 97 so as to be inclined to the Z direction along outer inclined surface portion 80 of inclination correction mechanism portion C1. A protrusion portion center line DL shown by a dotted line in FIG. 37 generally inclines and extends in the direction in which inclination correction mechanism portion V1 extends. Protrusion portion center line DL extends so as to be inclined to the Z direction.

Also in inclination correction mechanism portion V1 of semiconductor device 301, firm fixed portion 10 may be formed particularly in the wall surface on the inside in the X direction by integration with metal component 4 through caulking. Also by this caulking, in first protrusion-recess portion CV1, particularly the wall surface on the inside in the X direction includes: first wall surface portion S1 having first inclination angle IA1 to the Z direction; and second wall surface portion S2 having second inclination angle IA2 different from first inclination angle IA1. In addition, in first protrusion-recess portion CV1, the wall surfaces of inclination correction mechanism portion C1 and inclination correction mechanism portion V1 remain particularly on the outside in the X direction. In this case, first protrusion-recess portion CV1 is also assumed to include: the wall surfaces of inclination correction mechanism portion C1 and inclination correction mechanism portion V1; and the gap between inclination correction mechanism portion C1 and inclination correction mechanism portion V1. Thus, in the present embodiment, in addition to first wall surface portion S1 and second wall surface portion S2 as described above, two wall surfaces having different inclination angles can also be included due to the different angles of the wall surfaces of inclination correction mechanism portion C1 and inclination correction mechanism portion V1 that remain on the outside in the X direction.

As shown in FIG. 37, on the outside in the X direction, the wall surfaces of inclination correction mechanism portion C1 and inclination correction mechanism portion V1 remain, thereby providing a gap. Furthermore, a gap is provided also between bottom portion 99 of inclination correction mechanism portion C1 and leading end 97 of inclination correction mechanism portion V1. In addition, the wall surface of inclination correction mechanism portion C1 and the wall surface of inclination correction mechanism portion V1 may contact each other at least one contact point 90 so as to be integrated with each other.

Figure 38:
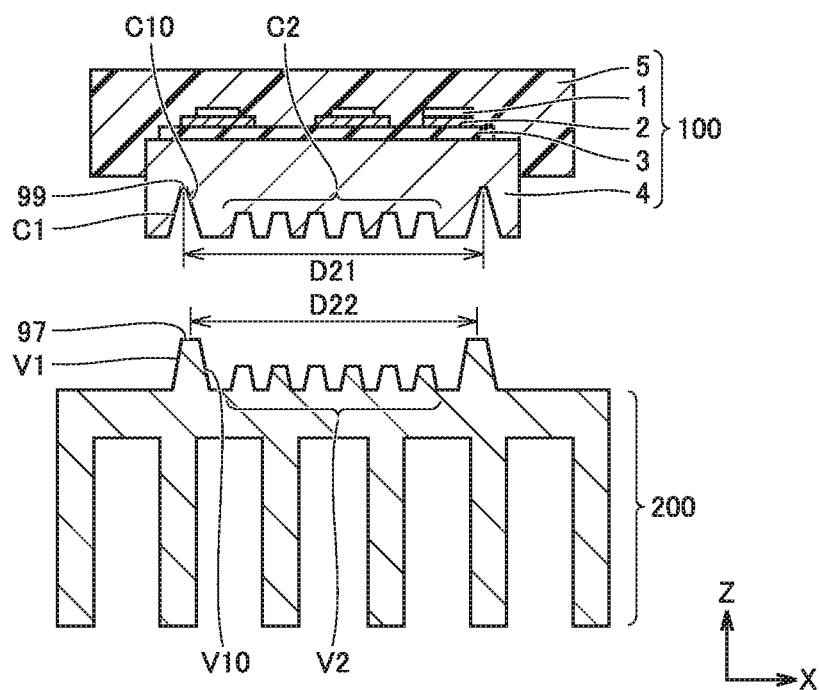
FIG. 38 is a schematic cross-sectional view showing the state of recess portions and protrusion portions formed in each of a metal component and a heat sink before integration of the metal component and the heat sink with each other, in the first example of the third embodiment.

Referring to FIG. 38, in the present embodiment, in the state before metal component 4 and heat sink 200 are integrated with each other as shown in FIG. 36, inclination correction mechanism portion V1 is different in position of the center portion in the X direction from inclination correction mechanism portion C1. Specifically, a center-to-center distance D21 between bottom portions 99 of one pair of inclination correction mechanism portions C1 to be included in one pair of first protrusion-recess portions CV1 is greater than a center-to-center distance D22 between leading ends 97 of one pair of inclination correction mechanism portions V1. In this case, the center-to-center distance means the distance between the center portions of one pair of inclination correction mechanism portions C1 (between the center portions of bottom portions 99) in the X direction, for example. Also in the present embodiment, connection portion V2 and connection portion C2 are approximately identical in position of the center portion in the X direction to each other. On the other hand, center-to-center distance D21 between one pair of inclination correction mechanism portions C1 may be smaller than center-to-center distance D22 between one pair of inclination correction mechanism portions V1. In this case, in contrast to FIG. 37, inclination correction mechanism portion V1 is caulked on the outside in the X direction and its wall surface remains on the inside in the X direction.

Figure 39:
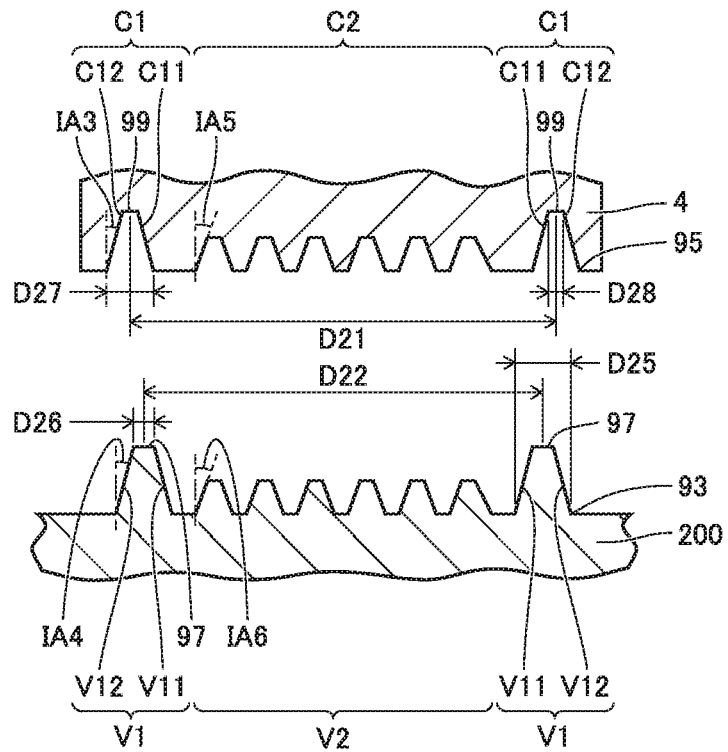
FIG. 39 is an enlarged schematic cross-sectional view showing dimensions and the like of each of the recess portions and the protrusion portions in FIG. 38.

More specifically, referring to FIG. 39, center-to-center distance D21 between bottom portions 99 of one pair of inclination correction mechanism portions C1 is greater than center-to-center distance D22 between leading ends 97 of one pair of inclination correction mechanism portions V1 as described above. Furthermore, width D26 of leading end 97 of inclination correction mechanism portion V1 is greater than width D28 of bottom portion 99 of inclination correction mechanism portion C1. Width D27 of opening 95 of inclination correction mechanism portion C1 is greater than width D26 of leading end 97 of inclination correction mechanism portion V1. Furthermore, a maximum width D25 of base portion 93 of inclination correction mechanism portion V1 is smaller than width D27 of opening 95 of inclination correction mechanism portion C1.

Figure 40:
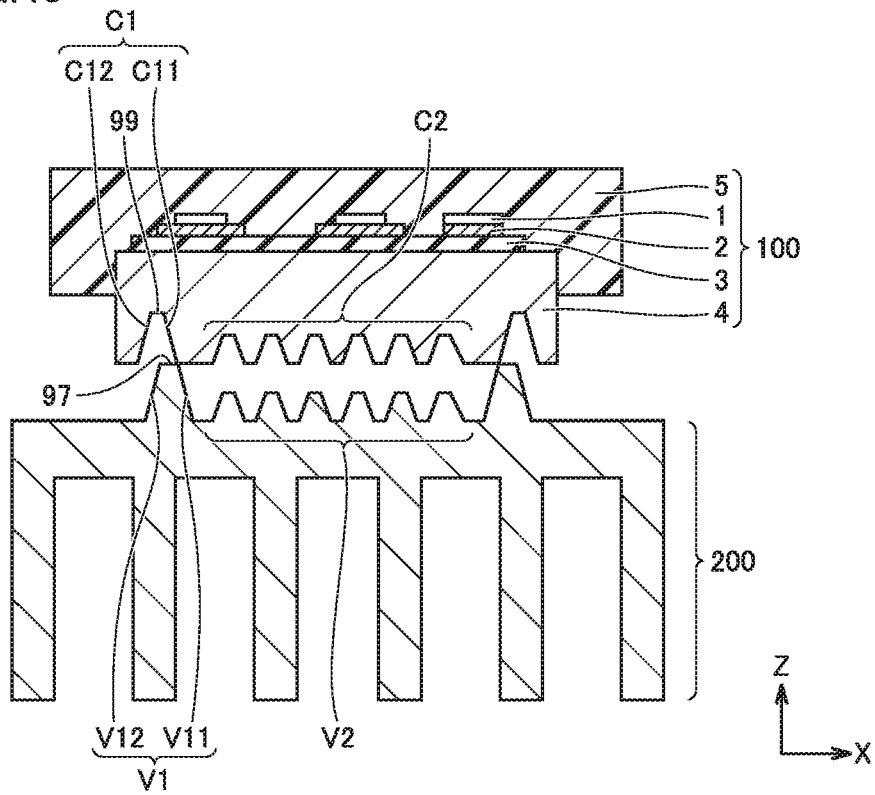
FIG. 40 is a schematic cross-sectional view showing the first step of a method of manufacturing a semiconductor device according to the first example of the third embodiment.

Then, a method of manufacturing semiconductor device 301 in the first example of the present embodiment will be hereinafter described with reference to FIGS. 40 to 43. The method of manufacturing semiconductor device 301 is applied basically corresponding to the method of manufacturing semiconductor device 101 in the first embodiment. However, as described above, the center-to-center distance between bottom portions 99 of one pair of inclination correction mechanism portions C1 is greater than the center-to-center distance between leading ends 97 of one pair of inclination correction mechanism portions V1. Referring to FIG. 40, assuming that inclination correction mechanism portion C1 includes wall surface C11 and wall surface C12 inclined to the Z direction, and inclination correction mechanism portion V1 includes wall surface V11 and wall surface V12 inclined to the Z direction, then when inclination correction mechanism portion C1 and inclination correction mechanism portion V1 are fitted into each other in the integrating step, wall surface V11 on the inside in the X direction contacts wall surface C11 on the inside in the X direction before connection portion C2 and connection portion V2 contact each other.

Figure 41:
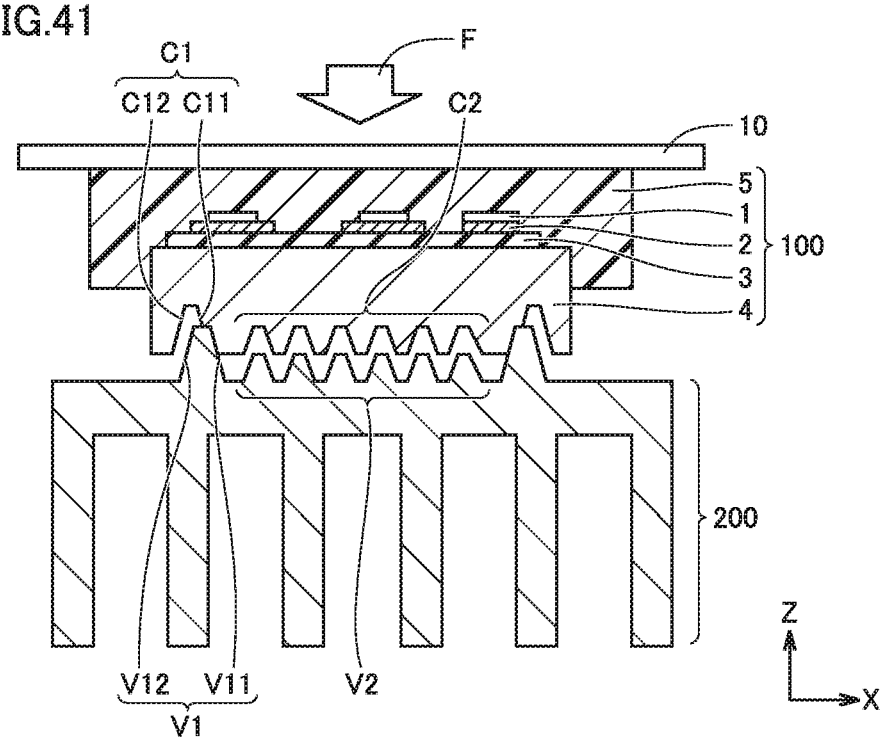
FIG. 41 is a schematic cross-sectional view showing the second step of the method of manufacturing a semiconductor device according to the first example of the third embodiment.
Figure 42:
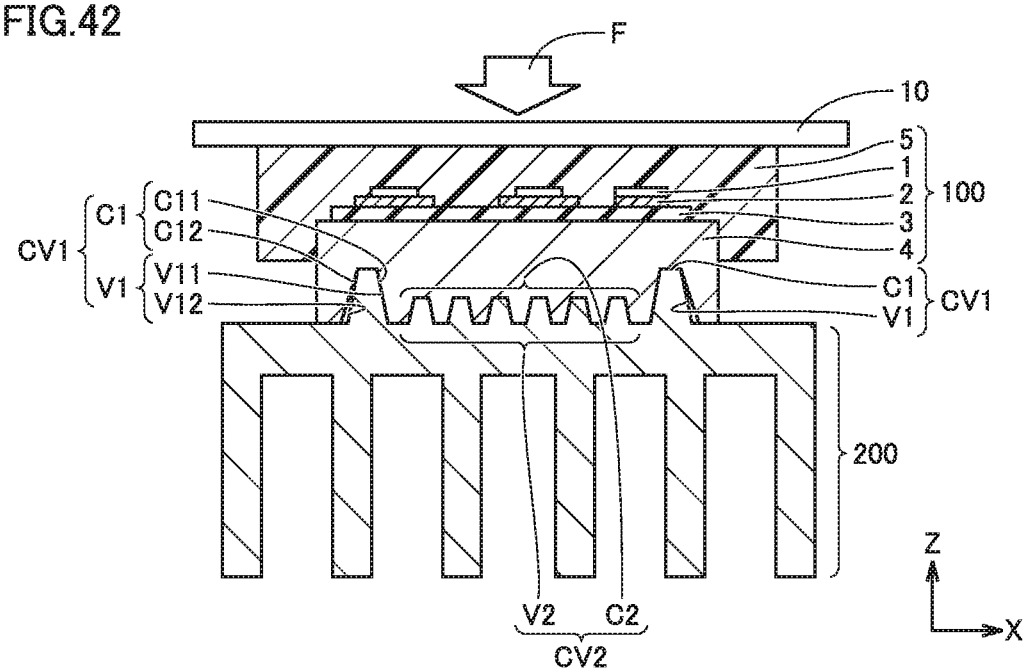
FIG. 42 is a schematic cross-sectional view showing the third step of the method of manufacturing a semiconductor device according to the first example of the third embodiment.
Figure 43:
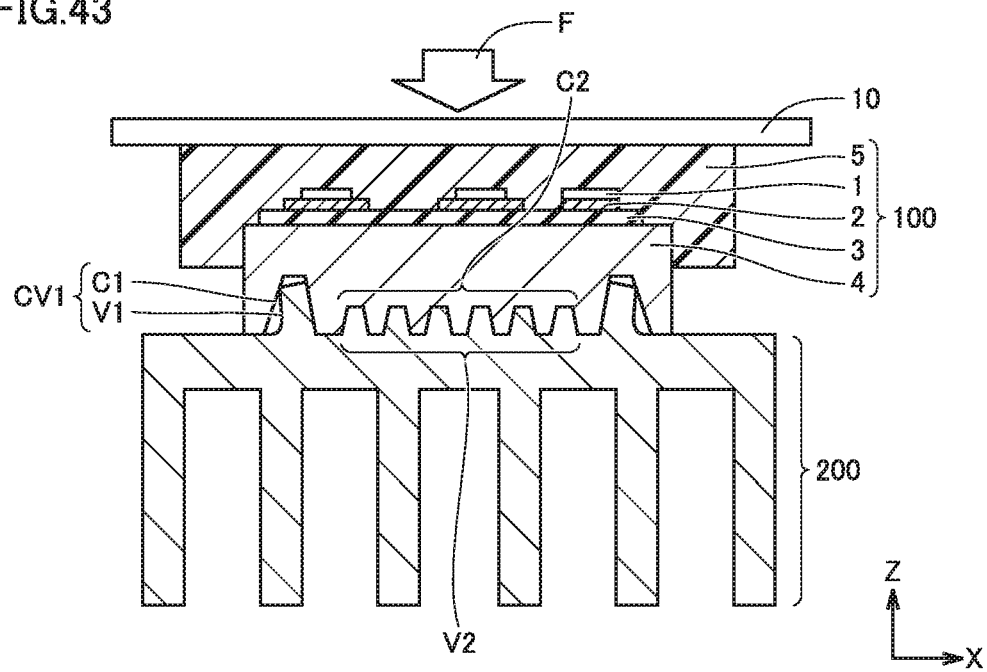
FIG. 43 is a schematic cross-sectional view showing the fourth step of the method of manufacturing a semiconductor device according to the first example of the third embodiment.

Referring to FIGS. 41 to 43, as in the steps in FIGS. 6 to 8, by pressing force F to pressure applying means 20 on power module 100, inclination correction mechanism portion C1 and inclination correction mechanism portion V1 fitted into each other are plastically deformed while connection portion C2 and connection portion V2 fitted into each other are plastically deformed.

In this case, inclination correction mechanism portion V1 that is smaller in center-to-center distance than inclination correction mechanism portion C1 is inserted into inclination correction mechanism portion C1 so as to be aligned at the position of inclination correction mechanism portion C1 having a larger center-to-center distance. Thus, inclination correction mechanism portion V1 is inserted into inclination correction mechanism portion C1 while being inclined to the Z direction. As inclination correction mechanism portion V1 is inclined in this way, wall surface V11 is plastically deformed so as to be moved in the X direction along the tapered portion of wall surface C11. It is more preferable that the adjustment mechanism is disposed such that the longitudinal direction of metal component 4 extends in the X direction since an inclination correction effect is further achieved. Thus, inclination correction mechanism portion C1 and inclination correction mechanism portion V1 contact each other, so that at least one of inclination correction mechanism portion C1 and inclination correction mechanism portion V1 is plastically deformed, thereby causing caulking to progress. Thereby, only one pair of first protrusion-recess portions CV1 is formed such that second protrusion-recess portion CV2 is sandwiched therebetween.

In this case, when manufacturing semiconductor device 301, it is preferable to adjust the materials of metal component 4 and heat sink 200 such that the member provided with recess portions is higher in hardness than the member provided with protrusion portions. In this case, since recess portions are formed in metal component 4 while protrusion portions are formed in heat sink 200, metal component 4 is formed to be higher in hardness than heat sink 200. This facilitates deformation such that protrusion portion center line DL of inclination correction mechanism portion V1 is inclined upon application of pressing force F. Thus, when inclination correction mechanism portion C1 and inclination correction mechanism portion V1 contact each other, which is then further pressurized to cause connection portion C2 and connection portion V2 to contact each other so as to be caulked, the unintentional force caused by blocked state of inclination correction mechanism portion C1 and inclination correction mechanism portion V1 can be readily leaked to the outside by deformation of inclination correction mechanism portion V1. This can reduce the influence of connection portions C2 and V2 upon caulking, so that inclinations of connection portions C2 and V2 can be suppressed. Accordingly, it becomes possible to reduce the influence of second protrusion-recess portion CV2 formed of connection portions C2 and V2 upon the heat dissipation performance.

Figure 44:
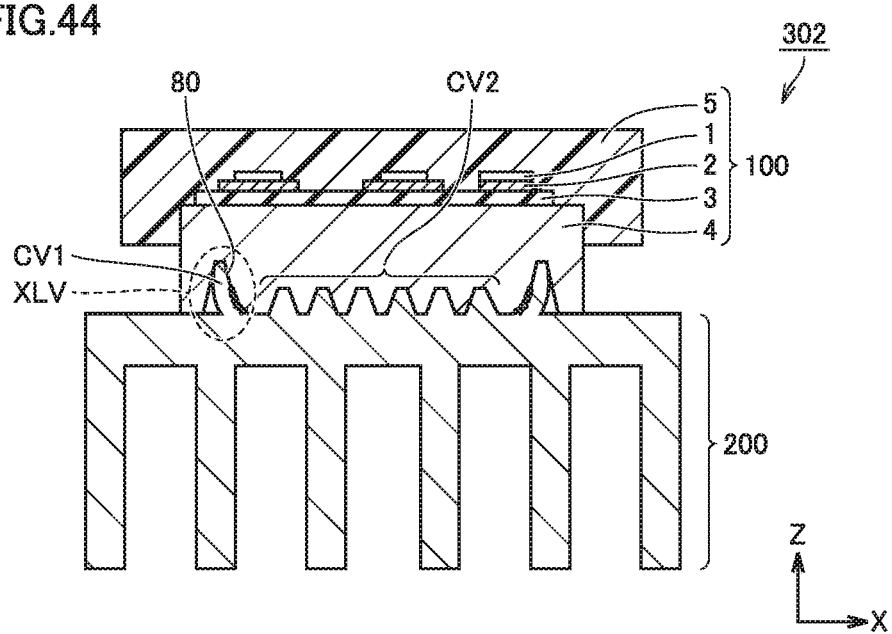
FIG. 44 is a schematic cross-sectional view showing the configuration of a semiconductor device according to the second example of the third embodiment.
Figure 45:
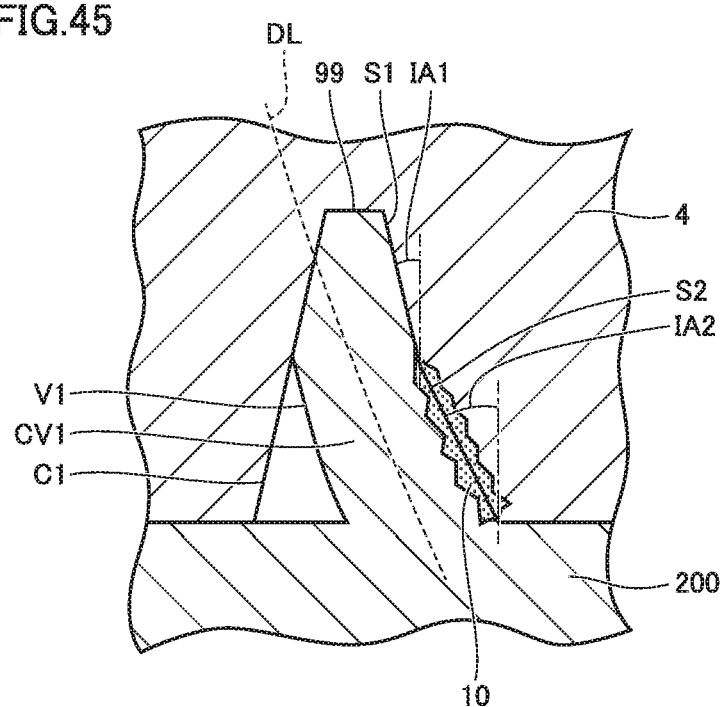
FIG. 45 is an enlarged schematic cross-sectional view of a region XLV surrounded by a dotted line in FIG. 44.
Figure 46:
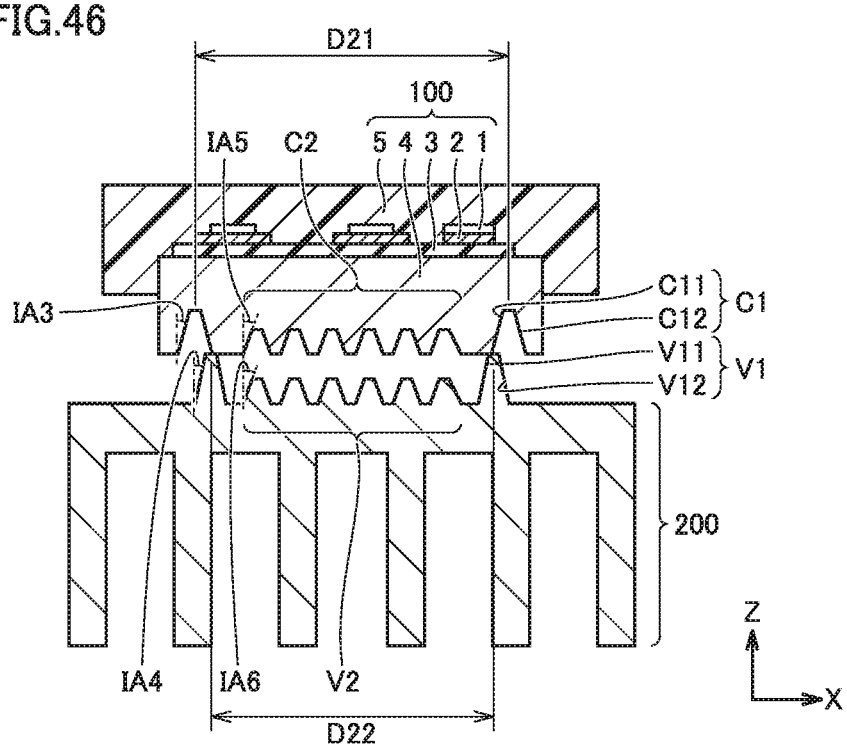
FIG. 46 is a schematic cross-sectional view showing the state of recess portions and protrusion portions formed in each of a metal component and a heat sink before integration of the metal component and the heat sink with each other, in the second example of the third embodiment.

Then, the configuration of a semiconductor device 302 in the second example of the present embodiment will be hereinafter described with reference to FIGS. 44 to 46. Referring to FIGS. 44 to 46, a semiconductor device 302 in the second example of the present embodiment has basically the same configuration as that of semiconductor device 301, and therefore, the detailed description thereof will not be repeated. Semiconductor device 302 shown in FIG. 45 may be configured such that inclination correction mechanism portion V1 contact bottom portion 99 of inclination correction mechanism portion C1 with no gap formed therebetween, and metal component 4 and heat sink 200 are integrated with each other.

In order to achieve the above-described configuration, for example, referring to FIGS. 46 and 39, in semiconductor device 302 in the second example of the present embodiment, as compared with semiconductor device 301 in the first example of the present embodiment, maximum width D25 of inclination correction mechanism portion V1 is reduced, and inclination angle IA4 of inclination correction mechanism portion V1 is reduced, but a leading end width D26 of inclination correction mechanism portion V1 is not changed. Alternatively, as a modification, in semiconductor device 302 in the second example of the present embodiment, widths D25 and D26 may be reduced without changing inclination angle IA4 of inclination correction mechanism portion V1, as compared with semiconductor device 301 in the first example of the present embodiment.

In the above-described modification, width D26 of leading end 97 of inclination correction mechanism portion V1 may not need to be greater (for example, may be smaller) than width D28 of bottom portion 99 of inclination correction mechanism portion C1.

Figure 47:
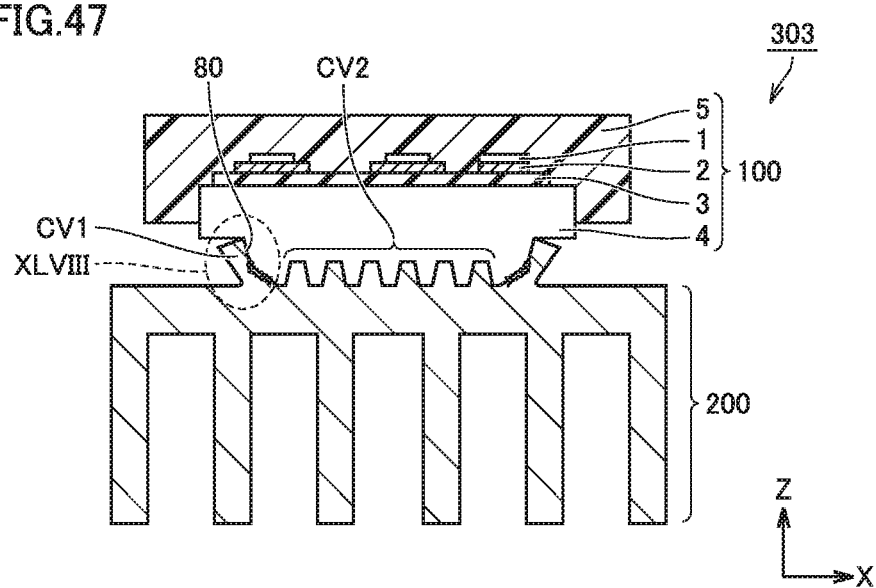
FIG. 47 is a schematic cross-sectional view showing the configuration of a semiconductor device according to the third example of the third embodiment.
Figure 48:
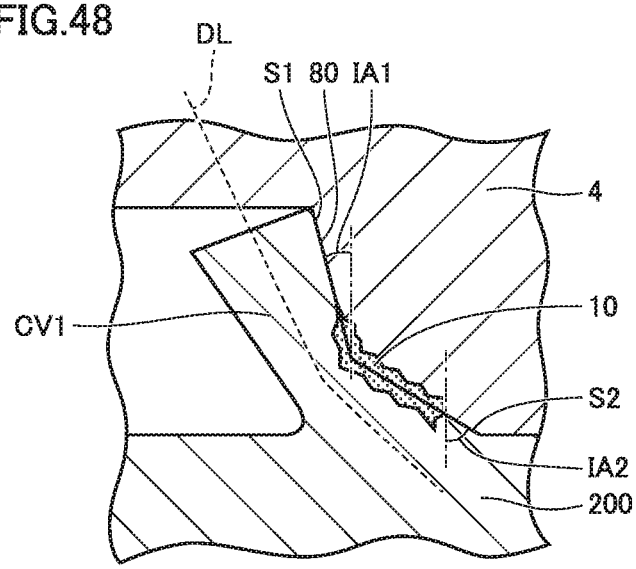
FIG. 48 is an enlarged schematic cross-sectional view of a region XLVIII surrounded by a dotted line in FIG. 47.
Figure 49:
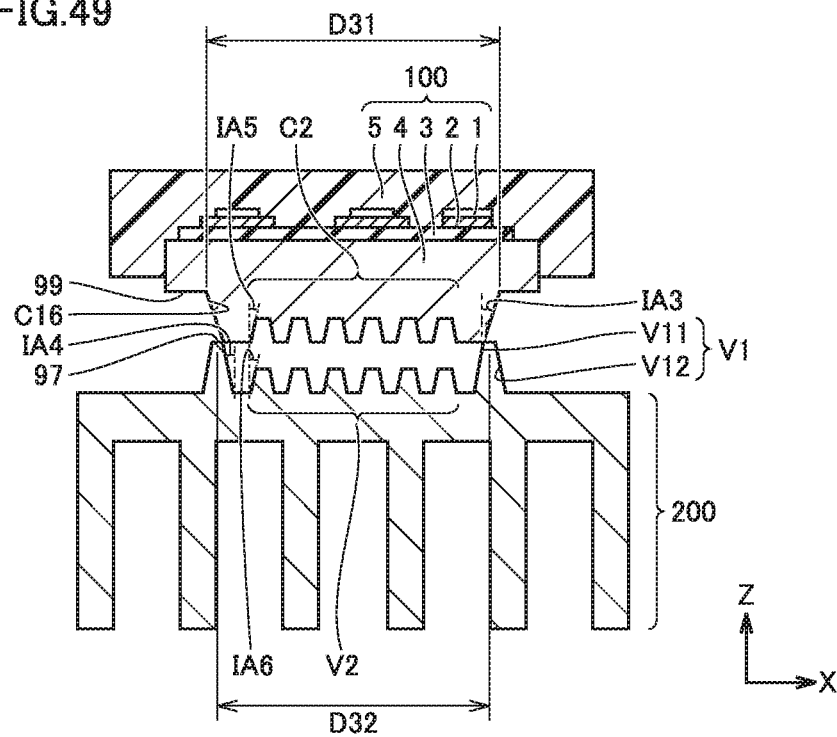
FIG. 49 is a schematic cross-sectional view showing the state of recess portions and protrusion portions formed in each of a metal component and a heat sink before integration of the metal component and the heat sink with each other, in the third example of the third embodiment.

Then, the configuration of a semiconductor device 303 in the third example of the present embodiment will be hereinafter described with reference to FIGS. 47 to 49. Referring to FIGS. 47 to 49, since semiconductor device 303 in the third example of the present embodiment has basically the same configuration as those of semiconductor devices 301 and 302, the portions having the same configurations as those of semiconductor devices 301 and 302 in semiconductor device 303 are designated by the same reference characters, and the description thereof will not be repeated. However, in semiconductor device 303 in FIG. 47, metal component 4 is provided with a plurality of outer inclined surface portions 80 each as a mere flat plane in place of inclination correction mechanism portion C1. In semiconductor device 303, these plurality of outer inclined surface portions 80 contact a plurality of inclination correction mechanism portions V1 as protrusion portions. Further, a plurality of (a pair of) first protrusion-recess portions CV1 is formed such that outer inclined surface portions 80 and inclination correction mechanism portions V1 are integrated with each other.

In semiconductor device 301, outer inclined surface portion 80 is disposed on the inside in the X direction of inclination correction mechanism portion C1 formed in a recessed shape as a part of its inner wall surface. Outer inclined surface portion 80 is disposed also in semiconductor device 303 at the same position as described above. However, outer inclined surface portion 80 is not formed inside inclination correction mechanism portion C1 as a portion included in inclination correction mechanism portion C1, but formed in the outermost portion of metal component 4. In other words, semiconductor device 303 is different from semiconductor device 301 in that first protrusion-recess portion CV1 is disposed such that its outside is exposed in the X direction.

First protrusion-recess portion CV1 shown in FIG. 47 is different in configuration from semiconductor devices 301 and 302 each formed to include inclination correction mechanism portion C1 as other recess portions.

Then, the differences between the method of manufacturing semiconductor device 303 and particularly the method of manufacturing semiconductor device 301 will be hereinafter described with reference to FIG. 49. Referring to FIG. 49, metal component 4 is provided with an outer inclined surface portion C16 in place of inclination correction mechanism portion C1 formed in a recessed shape. In other words, metal component 4 is provided with a plurality of outer inclined surface portions C16 and connection portion C2 as a plurality of recess portions. Heat sink 200 is provided with inclination correction mechanism portion V1 and connection portion V2 as a plurality of protrusion portions.

Outer inclined surface portion C16 is formed in a region of metal component 4 where inclination correction mechanism portion C1 is formed in semiconductor device 301. In other words, outer inclined surface portion C16 is formed on each of the right and left ends in the X direction so as to sandwich connection portion C2 therebetween.

Outer inclined surface portion C16 is formed such that its wall surface is exposed to the outside in the X direction, and also formed to have an inclination angle IA3 in the Z direction. Outer inclined surface portion C16 is larger in dimension in the Z direction than connection portion C2. Furthermore, a distance D31 between the inner circumferences of bottom portions 99 of one pair of outer inclined surface portions C16 to be included in one pair of first protrusion-recess portions CV1 is greater than a center-to-center distance D32 between leading ends 97 of one pair of inclination correction mechanism portions V1 to be included in one pair of first protrusion-recess portions CV1.

In this case, bottom portion 99 of outer inclined surface portion C16 is a flat plane along the X-Y plane disposed so as to surround the outside of the uppermost portion of outer inclined surface portion C16 in the Z direction in a plan view. Thus, bottom portion 99 of outer inclined surface portion C16 intersects the uppermost portion of outer inclined surface portion C16, and is approximately equal in Z coordinate to this uppermost portion. Furthermore, distance D31 between the inner circumferences means the distance in the X direction between bottom portions 99 of one pair of outer inclined surface portions C16, that is, between the uppermost portions of one pair of outer inclined surface portions in the Z direction.

In this way, metal component 4 provided with outer inclined surface portion C16 and connection portion C2; and heat sink 200 provided with inclination correction mechanism portion V1 having wall surfaces V11, V12 and connection portion V2 as in semiconductor device 301 and the like are fitted and integrated with each other as in each of the above-described other embodiments. In this case, by pressing force F applied to pressure applying means 20 on power module 100, inclination correction mechanism portion V1 having center-to-center distance D32 smaller than distance D31 between the inner circumferences of outer inclined surface portions C16 is to be integrated with the wall surface of outer inclined surface portion C16 so as to be aligned at the position of outer inclined surface portion C16 having a larger distance between the inner circumferences, as in the method of manufacturing semiconductor device 301. Accordingly, inclination correction mechanism portion V1 is plastically deformed, that is, caulked, so as to be integrated with outer inclined surface portion C16 while being inclined to the Z direction, thereby achieving the state as shown in FIGS. 47 and 48. In this way, as outer inclined surface portion C16 and inclination correction mechanism portion V1 contact each other, at least one of outer inclined surface portion C16 and inclination correction mechanism portion V1 is plastically deformed, thereby causing caulking to progress.

The functions and effects of the present embodiment will then be described.

Also in each of the above-described examples of the present embodiment, as in other embodiments, pressing force F is utilized to cause inclination correction mechanism portion V1 to contact inclination correction mechanism portion C1 or outer inclined surface portion C16. Thereby, at least one of: inclination correction mechanism portion C1 or outer inclined surface portion C16; and inclination correction mechanism portion V1 is plastically deformed, thereby causing caulking to progress. In order to further enhance the guide effect caused when inclination correction mechanism portion V1 contacts inclination correction mechanism portion C1 or outer inclined surface portion C16 before leading end 97 contacts bottom portion 99, inclination correction mechanism portion C1 (outer inclined surface portion C16) and inclination correction mechanism portion V1 are configured to contact each other before connection portions C2 and V2 contact each other.

For example, in the first example and the second example, this is implemented due to the feature that distance D21 is greater than distance D22 in FIGS. 38 and 46. In other words, even when power module 100 and heat sink 200 are not appropriately positioned, but when power module 100 is pressurized downward in the Z direction using pressure applying means 20, wall surface V11 on the inside in the X direction of inclination correction mechanism portion V1 usually first contacts wall surface C11 of inclination correction mechanism portion C1. Then, since power module 100 is pressed downward in the Z direction with pressing force F applied to pressure applying means 20, inclination correction mechanism portion V1 is moved along wall surface C11 in the X direction. Thereby, the other wall surface V12 of inclination correction mechanism portion V1 then also contacts wall surface C12 of inclination correction mechanism portion C1. In this way, inclination correction mechanism portion V1 contacts inclination correction mechanism portion C1 on each of the right and left sides in the X direction before connection portions C2 and V2 contact each other. Thereby, the position of power module 100 in the XY direction is automatically determined uniquely at an accurate position relative to heat sink 200. Therefore, also in the present embodiment, inclination correction mechanism portions C1 and V1 can achieve the functions and effects for accurate positioning and inclination suppression of power module 100 as in the first embodiment.

Since the above-described processing method is used, first protrusion-recess portion CV1 is formed such that inclination correction mechanism portion V1 extends from base portion 93 toward leading end 97 so as to be inclined to the height direction, and also, first protrusion-recess portion CV1 includes first wall surface portion S1 having first inclination angle IA1 and second wall surface portion S2 having second inclination angle IA2.

In addition, particularly in semiconductor device 302 in the second example, width D26 of leading end 97 of inclination correction mechanism portion V1 does not necessarily have to be greater (for example, may be smaller) than width D28 of bottom portion 99 of inclination correction mechanism portion C1, as described above. In the present embodiment, center-to-center distance D21 between bottom portions 99 of one pair of inclination correction mechanism portions C1 is greater than center-to-center distance D22 between leading ends 97 of one pair of inclination correction mechanism portions V1. Thus, inclination correction mechanism portion V1 extends from base portion 93 to leading end 97 so as to be inclined to the height direction. Thereby, it is considered that the guide effect can be achieved when wall surfaces V11 and V12 of inclination correction mechanism portions V1 contact wall surfaces C11 and C12, respectively, of inclination correction mechanism portion C1 before leading end 97 of inclination correction mechanism portion V1 reaches bottom portion 99 of inclination correction mechanism portion C1. Thus, D28 may be smaller than D26.

Based on the above-described concept, semiconductor device 303 is obtained by removing a portion not adjacent to (on the outside in the X direction of) connection portion C2 from inclination correction mechanism portion C1 of semiconductor device 302. In semiconductor device 303, metal component 4 is not disposed on the outside in the X direction of first protrusion-recess portion CV1. Thus, firm fixed portion 10 provided by caulking of first protrusion-recess portion CV1 is less than those in semiconductor devices 301, 302, and the like. This can reduce the influence of this firm fixed portion 10 exerted during formation of second protrusion-recess portion CV2 by caulking of connection portions C2 and V2. In the example of semiconductor device 303, it is preferable to satisfy the condition that width D26 of leading end 97 of inclination correction mechanism portion V1 is smaller than width D27 of opening 95 of inclination correction mechanism portion C1.

Fourth Embodiment

FIGS. 50 to 54 show schematic cross-sectional views or schematic plan views each illustrating the step of causing a plurality of recess portions and a plurality of protrusion portions to be fitted into each other by pressure applying means 20, which is included in the method of manufacturing each of the semiconductor devices described above. For example, as shown in FIGS. 7 and 8, each of the above-described first to third embodiments illustrates an example in which pressure applying means 20 is placed over the entire upper surface of power module 100. However, as having been described in the above first embodiment, pressure applying means 20 cannot always contact the entire upper surface of power module 100 also in the configurations in FIGS. 7 and 8. The present embodiment illustrate the case where pressing force F cannot be entirely applied to power module 100 in a plan view.

Figure 50:
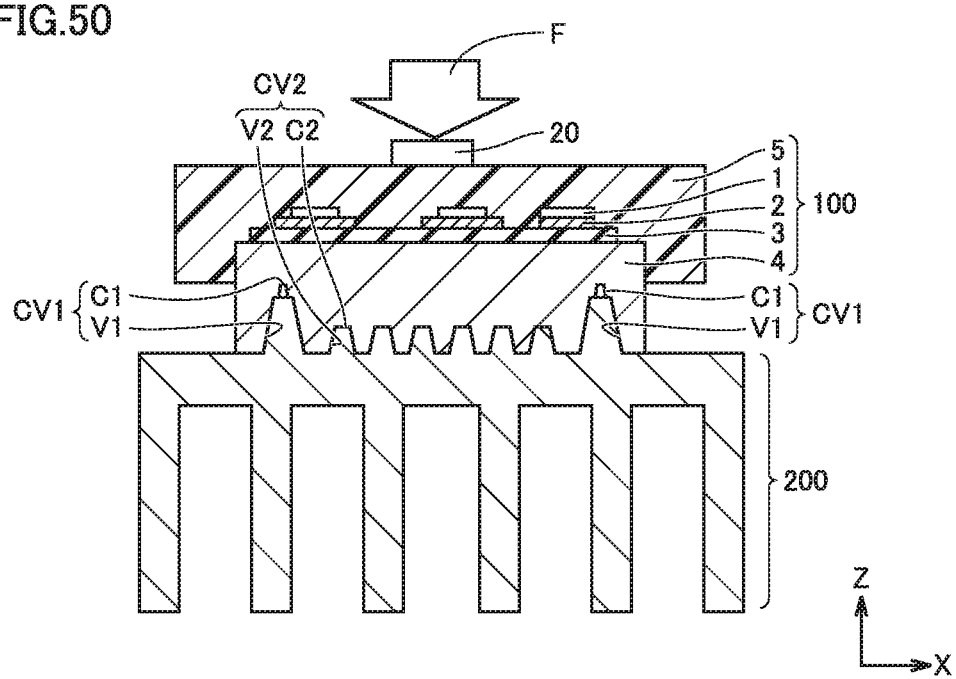
FIG. 50 is a schematic cross-sectional view showing pressure applying means and a pressure applying manner used in the step of manufacturing a semiconductor device in the first example of the fourth embodiment.
Figure 51:
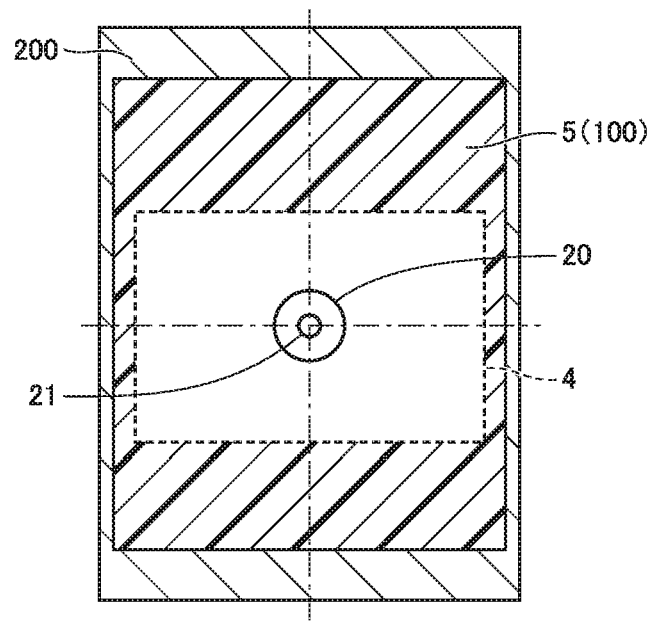
FIG. 51 is a schematic plan view showing the pressure applying means in FIG. 50.

For example, FIGS. 50 and 51 each show the case where, in the step of integrating metal component 4 and heat sink 200 with each other, one pressure applying means 20 is placed only in a part of the region (in the vicinity of the center portion) of power module 100 in a plan view, and pressing force F is exerted only onto this part. In order to sufficiently achieve the effects of inclination correction and positioning by inclination correction mechanism portions C1 and V1 as described in the first embodiment, it is preferable to provide a configuration in which pressure applying means 20 is placed to include the position corresponding to a center point 21 of the center portion in each of sealing member 5, metal component 4 and heat sink 200 in a plan view, and pressing force F is exerted only onto the portion of pressure applying means 20. In this case, when metal component 4 is provided with connection portions C2, V2 and the like as a plurality of recess portions or a plurality of protrusion portions so as to be point-symmetric with respect to center point 21 in a plan view, pressure applying means 20 is to be placed so as to particularly include the position corresponding to center point 21 in the protrusion-recess portion of metal component 4.

Figure 52:
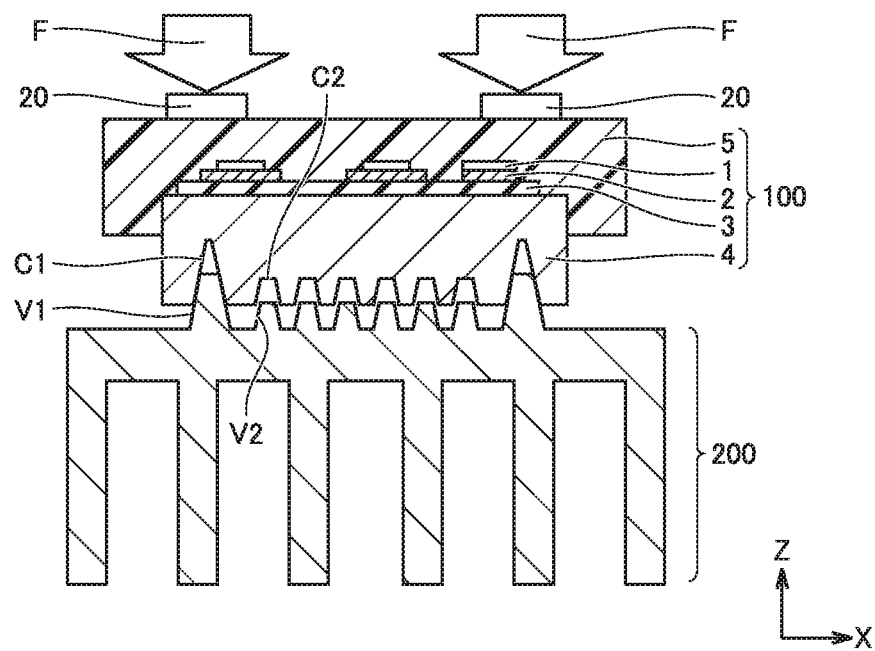
FIG. 52 is a schematic cross-sectional view showing pressure applying means and a pressure applying manner used in the step of manufacturing a semiconductor device in the second example of the fourth embodiment.
Figure 53:
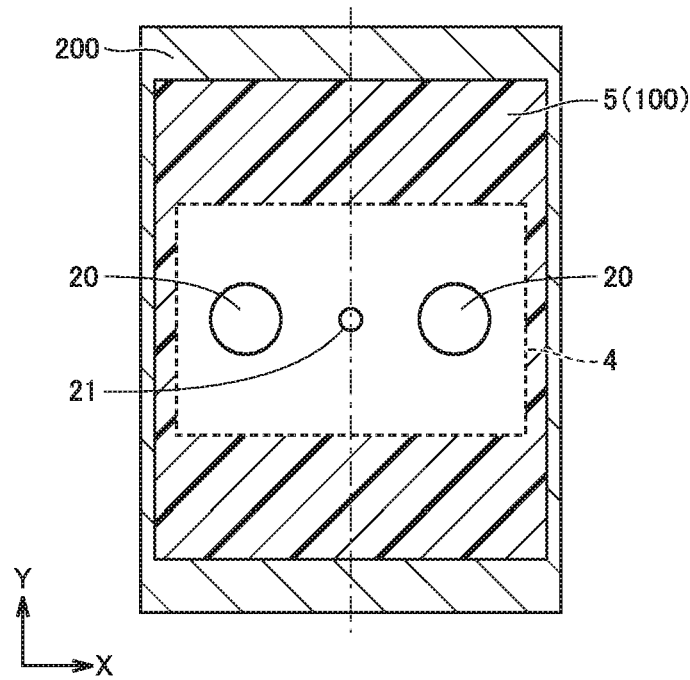
FIG. 53 is a schematic plan view showing the pressure applying means in FIG. 52.
Figure 54:
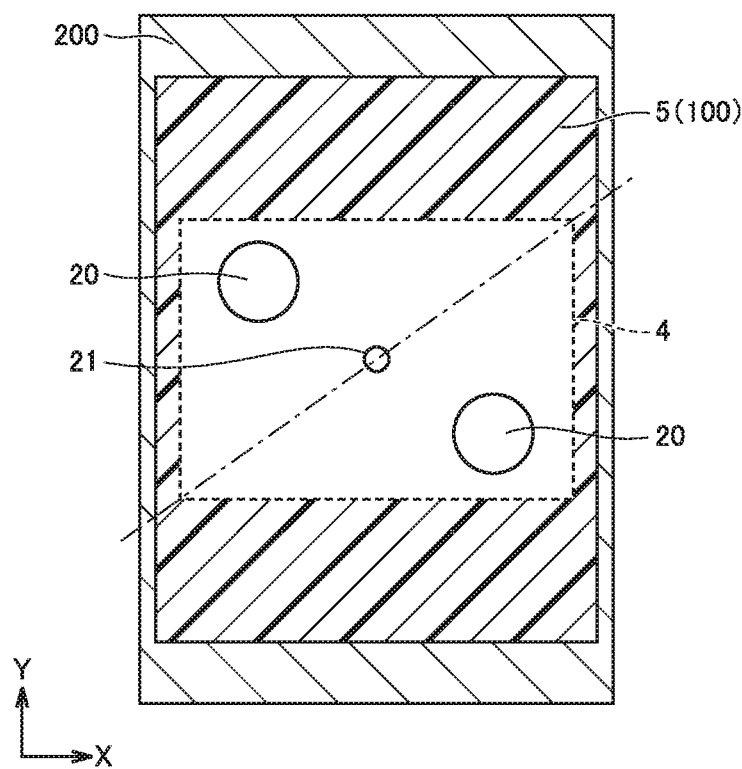
FIG. 54 is a schematic plan view showing a modification of the pressure applying means in FIG. 52.

For example, FIGS. 52 to 54 each show the case where, in the step of integrating metal component 4 and heat sink 200 with each other, two pressure applying means 20 are placed in a part of the region of power module 100 in a plan view, and pressing force F is exerted only onto the portion. In this case, it is preferable that a total of two pressure applying means 20 are disposed at positions that are point-symmetric with respect to center point 21 in the center portion (particularly, in the protrusion-recess portion) of metal component 4, that is, at two respective positions that are spaced at the same distance from center point 21, and pressing force F is exerted thereto. In this case, two pressure applying means 20 at positions that are point-symmetric with respect to each other may be disposed so as to be located on both sides of center point 21 in the X direction as shown in FIG. 53, or may be disposed so as to be located on both sides of center point 21 obliquely in the X direction and the Y direction as shown in FIG. 54. In addition, three or more pressure applying means 20 may be disposed as long as these pressure applying means 20 are disposed at positions that are point-symmetric to one another with respect to center point 21 in the center portion (particularly in the protrusion-recess portion) of metal component 4.

In this way, also in the case where pressure applying means 20 is disposed only in a part of the region of power module 100 in a plan view and pressurized, it is preferable that at least one or more pressure applying means 20 are disposed so as to be point-symmetric with respect to center point 21 in metal component 4 or center point 21 in the protrusion-recess portion of metal component 4. In this case, one pressure applying means 20 that is point-symmetric with respect to center point 21 means the case where pressure applying means 20 is placed so as to overlap with center point 21, as shown in FIGS. 50 and 51. In this way, inclination correction mechanism portions C1 and V1 can achieve the same functions and effects as those in other first to third embodiments.

In addition, when pressure applying means 20 is disposed only in a part of the region in power module 100 in a plan view as shown in FIGS. 50 to 54, deformation of sealing member 5 made of resin causes a stress concentration to occur in the boundary between the region pressurized by pressure applying means 20 and the region not pressurized, and also in the region adjacent to the boundary. Accordingly, if semiconductor element 1 is located at the above-described position, semiconductor element 1 may be broken by the above-mentioned stress. Thus, it is preferable that semiconductor element 1 is disposed in the region other than this boundary. By positioning semiconductor element 1 so as not to be located in the above-mentioned boundary, cracking of semiconductor element 1 resulting from the stress concentration onto the above-mentioned boundary can be suppressed, so that the productivity can be further improved.

The characteristics described in (each of the examples included in) each of the embodiments described above can be combined for application as appropriate within the range where technical inconsistency does not occur.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST

1 semiconductor element, 2 interconnection member, 3 insulating layer, 4 metal component, 5 sealing member, 10 firm fixed portion, 20 pressure applying means, 21 center point, 30 bent portion, 80 outer inclined surface portion, 90 contact point, 91 gap, 93 base portion, 95 opening, 97 leading end, 99 bottom portion, 100 power module, 101, 102, 103, 201, 202, 203, 301, 302, 303 semiconductor device, 200 heat sink, C1, V1 inclination correction mechanism portion, C2, V2 connection portion, C10, V10 pre-integration wall surface, C11, C12, V11, V12 wall surface, C16 outer inclined surface portion, CV1 first protrusion-recess portion, CV2 second protrusion-recess portion, DL protrusion portion center line, F pressing force, IA1 first inclination angle, IA2 second inclination angle, S1 first wall surface portion, S2 second wall surface portion, S3 third wall surface portion.

The invention claimed is:
1. A semiconductor device comprising:
   a power module including
      a semiconductor element, and
      a sealing member configured to seal the semiconductor element and a metal component having the semiconductor element mounted thereon, at least a part of the metal component being exposed from the sealing member; and
   a heat dissipation member connected to the metal component of the power module, wherein
   the metal component is provided with one of (i) a plurality of recess portions and (ii) a plurality of protrusion portions while the heat dissipation member is provided with the other of (i) a plurality of recess portions and (ii) a plurality of protrusion portions, a first protrusion-recess portion as a part of a plurality of protrusion-recess portions that are formed of the plurality of recess portions and the plurality of protrusion portions includes one recess portion and one protrusion portion, the first protrusion-recess portion is greater in height direction dimension than a second protrusion-recess portion other than the first protrusion-recess portion among the plurality of protrusion-recess portions, the first protrusion-recess portion has a wall surface including a first wall surface portion having a first inclination angle to a height direction, a second wall surface portion having a second inclination angle different from the first inclination angle, a third wall surface portion having a third inclination angle to a height direction, and a fourth wall surface portion having a fourth inclination angle different from the third inclination angle, and the metal component and the heat dissipation member are integrated with each other in the plurality of protrusion-recess portions where the plurality of recess portions contact the plurality of protrusion portions.

2. The semiconductor device according to claim 1, wherein the plurality of recess portions and the plurality of protrusion portions are arranged in a dot pattern in a plan view.

3. The semiconductor device according to claim 1, wherein a recess portion of the plurality of recess portions that forms the first protrusion-recess portion is greater in height direction dimension than a protrusion portion of the plurality of protrusion portions that forms the first protrusion-recess portion.

4. The semiconductor device according to claim 1, wherein one pair of first protrusion-recess portions is disposed so as to sandwich the second protrusion-recess portion therebetween.

5. The semiconductor device according to claim 4, wherein the metal component is provided with one of (i) the plurality of recess portions and a plurality of outer inclined surface portions each as a part of a corresponding one of the plurality of recess portions and (ii) the plurality of protrusion portions while the heat dissipation member is provided with the other of (i) the plurality of recess portions and the plurality of outer inclined surface portions and (ii) the plurality of protrusion portions, the one pair of first protrusion-recess portions extends such that one pair of protrusion portions each included in a corresponding one of the one pair of first protrusion-recess portions is inclined from a base portion toward a leading end along the plurality of outer inclined surface portions relative to the height direction, and the metal component and the heat dissipation member are integrated with each other in the plurality of first protrusion-recess portions where the plurality of outer inclined surface portions contact the plurality of protrusion portions, and in the plurality of second protrusion-recess portions where the plurality of recess portions contact the plurality of protrusion portions.

6. The semiconductor device according to claim 1, wherein one first protrusion-recess portion is disposed in a center portion in a direction in which the first protrusion-recess portion and the second protrusion-recess portion are arranged.

7. The semiconductor device according to claim 1, wherein the metal component is different in hardness from the heat dissipation member.

8. A method of manufacturing a semiconductor device, the method comprising:

preparing a power module including a semiconductor element, a metal component having the semiconductor element fixed thereto and provided with one of (i) a plurality of recess portions and (ii) a plurality of protrusion portions, and a sealing member configured to seal the semiconductor element, at least a part of the metal component being exposed from the sealing member;

preparing a heat dissipation member provided with the other of (i) a plurality of recess portions and (ii) a plurality of protrusion portions, the heat dissipation member being connected to the power module; and fitting the plurality of recess portions and the plurality of protrusion portions into each other to form a plurality of protrusion-recess portions, and integrating the metal component and the heat dissipation member with each other, wherein a first protrusion-recess portion as a part of the plurality of protrusion-recess portions is greater in height direction dimension than a second protrusion-recess portion other than the first protrusion-recess portion among the plurality of protrusion-recess portions, a wall surface of a first recess portion of the plurality of recess portions that is to be included in the first protrusion-recess portion is formed as an inclined surface inclined to a height direction, a wall surface of a first protrusion portion of the plurality of protrusion portions that is to be included in the first protrusion-recess portion is formed as an inclined surface inclined to the height direction, the wall surface of the first recess portion is different in inclination angle from the wall surface of the first protrusion portion fitted into the first recess portion, in the integrating, the first recess portion and the first protrusion portion contact each other to plastically deform at least one of the first recess portion and the first protrusion portion, the plurality of recess portions include a second recess portion to be included in the second protrusion-recess portion, the plurality of protrusion portions include a second protrusion portion to be included in the second protrusion-recess portion, and when the plurality of recess portions and the plurality of protrusion portions are fitted into each other in the integrating, the first recess portion and the first protrusion portion contact each other before the second recess portion and the second protrusion portion contact each other.

9. The method of manufacturing a semiconductor device according to claim 8, wherein a leading end of the first protrusion portion is greater in width than a bottom portion of the first recess portion, and an opening of the first recess portion is greater in width than the leading end of the first protrusion portion.

10. The method of manufacturing a semiconductor device according to claim 8, wherein the wall surface of the first recess portion is at least partially greater in inclination angle to the height direction than the wall surface of the first protrusion portion, and a width of the first recess portion is reduced toward a bottom portion of the first recess portion.

11. The method of manufacturing a semiconductor device according to claim 8, wherein only one pair of first protrusion-recess portions is formed so as to sandwich the second protrusion-recess portion therebetween.

12. The method of manufacturing a semiconductor device according to claim 8, wherein the first recess portion is greater in height direction dimension than the first protrusion portion.

13. A method of manufacturing a semiconductor device, the method comprising:

preparing a power module including
a semiconductor element,
a metal component having the semiconductor element fixed thereto and provided with one of (i) a plurality of recess portions and (ii) a plurality of protrusion portions, and
a sealing member configured to seal the semiconductor element, at least a part of the metal component being exposed from the sealing member;

preparing a heat dissipation member provided with the other of (i) a plurality of recess portions and (ii) a plurality of protrusion portions, the heat dissipation member being connected to the power module; and fitting the plurality of recess portions and the plurality of protrusion portions into each other to form a plurality of protrusion-recess portions, and integrating the metal component and the heat dissipation member with each other, wherein a first protrusion-recess portion as a part of the plurality of protrusion-recess portions is greater in height direction dimension than a second protrusion-recess portion other than the first protrusion-recess portion among the plurality of protrusion-recess portions, a wall surface of a first recess portion of the plurality of recess portions that is to be included in the first protrusion-recess portion is formed as an inclined surface inclined to a height direction, a wall surface of a first protrusion portion of the plurality of protrusion portions that is to be included in the first protrusion-recess portion is formed as an inclined surface inclined to the height direction, only one pair of first protrusion-recess portions is formed so as to sandwich the second protrusion-recess portion therebetween, a center-to-center distance between bottom portions of one pair of first recess portions to be included in the one pair of first protrusion-recess portions is different from a center-to-center distance between leading ends of one pair of first protrusion portions to be included in the one pair of first protrusion-recess portions, in the integrating, the first recess portion and the first protrusion portion contact each other to plastically deform at least one of the first recess portion and the first protrusion portion, the plurality of recess portions include a second recess portion to be included in the second protrusion-recess portion, the plurality of protrusion portions include a second protrusion portion to be included in the second protrusion-recess portion, and when the plurality of recess portions and the plurality of protrusion portions are fitted into each other in the integrating, the first recess portion and the first protrusion portion contact each other before the second recess portion and the second protrusion portion contact each other.

14. The method of manufacturing a semiconductor device according to claim 13, wherein the center-to-center distance between the bottom portions of the one pair of first recess portions to be included in the one pair of first protrusion-recess portions is greater than the center-to-center distance between the leading ends of the one pair of first protrusion portions to be included in the one pair of first protrusion-recess portions.

15. The method of manufacturing a semiconductor device according to claim 13, wherein the preparing a power module includes preparing a power module that includes
the semiconductor element,
the metal component provided with one of (i) the plurality of recess portions and a plurality of outer inclined surface portions each as a part of a corresponding one of the plurality of recess portions and (ii) the plurality of protrusion portions, and
the sealing member configured to seal the semiconductor element and at least a part of the metal component, the preparing a heat dissipation member connected to the power module includes forming the other of (i) the plurality of recess portions and the plurality of outer inclined surface portions and (ii) the plurality of protrusion portions, and the integrating includes fitting the plurality of recess portions and the plurality of protrusion portions into each other, and fitting the plurality of outer inclined surface portions and the plurality of protrusion portions into each other, to form a plurality of protrusion-recess portions, and integrating the metal component and the heat dissipation member with each other, a first protrusion-recess portion among the plurality of protrusion-recess portions that is formed of an outer inclined surface portion of the plurality of outer inclined surface portions and a protrusion portion of the plurality of protrusion portions is greater in height direction dimension than a second protrusion-recess portion among the plurality of protrusion-recess portions that is formed of a recess portion of the plurality of recess portions and the protrusion portion, a wall surface of the outer inclined surface portion to be included in the first protrusion-recess portion is formed as an inclined surface inclined to a height direction, a wall surface of a first protrusion portion of the plurality of protrusion portions that is to be included in the first protrusion-recess portion is formed as an inclined surface inclined to the height direction, a distance between inner circumferences of bottom portions of one pair of outer inclined surface portions to be included in the one pair of first protrusion-recess portions is greater than a center-to-center distance between leading ends of one pair of first protrusion portions to be included in the one pair of first protrusion-recess portions, the distance between inner circumferences being provided in forming the plurality of recess portions, the plurality of outer inclined surface portions and the plurality of protrusion portions, and in the integrating, the outer inclined surface portion and the first protrusion portion contact each other to plastically deform at least one of the outer inclined surface portion and the first protrusion portion.

16. The method of manufacturing a semiconductor device according to claim 8, wherein the metal component is different in hardness from the heat dissipation member.

* * * * *